(12) United States Patent
Asano

(10) Patent No.: US 9,202,857 B2
(45) Date of Patent: *Dec. 1, 2015

(54) DISPLAY DEVICE

(71) Applicant: Sony Corporation

(72) Inventor: Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/492,581

(22) Filed: Sep. 22, 2014

(65) Prior Publication Data

US 2015/0102322 A1    Apr. 16, 2015

Related U.S. Application Data

(60) Continuation of application No. 13/911,401, filed on Jun. 6, 2013, now Pat. No. 8,860,297, which is a continuation of application No. 13/295,948, filed on Nov. 14, 2011, now Pat. No. 8,476,821, which is a division of application No. 12/000,811, filed on Dec. 18, 2007, now Pat. No. 8,058,795.

(30) Foreign Application Priority Data

Jan. 12, 2007   (JP) .................................. 2007-004278

(51) Int. Cl.
*H01L 51/50* (2006.01)
*H01L 51/52* (2006.01)
(Continued)

(52) U.S. Cl.
CPC .......... *H01L 27/3279* (2013.01); *G09G 3/3233* (2013.01); *H01L 27/3262* (2013.01); *H01L 51/5203* (2013.01); G09G 2300/0819 (2013.01); G09G 2300/0842 (2013.01);G09G 2300/0861 (2013.01); G09G 2300/0866 (2013.01); G09G 2310/0256 (2013.01); G09G 2320/043 (2013.01); H01L 27/3246 (2013.01); H01L 2251/558 (2013.01)

(58) Field of Classification Search
CPC ............ H01L 51/5228; H01L 51/5212; H01L 51/52–51/5234
USPC .................................................. 313/500–512
See application file for complete search history.

(56) References Cited

U.S. PATENT DOCUMENTS 6,933,672 B2    8/2005   Hosokawa
7,030,553 B2    4/2006   Winters et al.
(Continued)

FOREIGN PATENT DOCUMENTS

JP     08-234683 A     9/1996
JP     2005-203196 A   7/2005
KR     10-2002-0019002 3/2002

OTHER PUBLICATIONS

Korean Office Action issued Mar. 25, 2014 for corresponding Korean Application No. 10-2008-0001190.

*Primary Examiner* — Mariceli Santiago
(74) *Attorney, Agent, or Firm* — Michael Best & Friedrich LLP

(57) ABSTRACT

A display device in which pixels each including an emission area are arranged in a form of a matrix, the display device including: a first electrode formed from the emission area of the pixels to a non-emission area on a periphery of the emission area; a second electrode formed so as to be common to the pixels; and a light emitting material layer formed between the first electrode and the second electrode; wherein film thickness in the non-emission area of at least one of the first electrode and the second electrode is larger than film thickness in the emission area.

21 Claims, 23 Drawing Sheets

(51) Int. Cl.
*H01L 27/32* (2006.01)
*G09G 3/32* (2006.01)

(56) References Cited

U.S. PATENT DOCUMENTS

| | | |
|---|---|---|
| 7,839,081 B2 | 11/2010 | Kubota et al. |
| 8,860,297 B2 * | 10/2014 | Asano .......................... 313/503 |
| 2002/0033664 A1 | 3/2002 | Kobayashi |
| 2003/0137325 A1 | 7/2003 | Yamazaki et al. |
| 2003/0201447 A1 | 10/2003 | Yamazaki et al. |
| 2005/0007015 A1 | 1/2005 | Yokoyama et al. |
| 2005/0040762 A1 | 2/2005 | Kurihara |
| 2006/0103324 A1 | 5/2006 | Kim et al. |
| 2007/0262707 A1 | 11/2007 | Lee et al. |
| 2008/0018243 A1 | 1/2008 | Ishiguro et al. |
| 2010/0013383 A1 | 1/2010 | Kim et al. |

* cited by examiner

F I G . 3
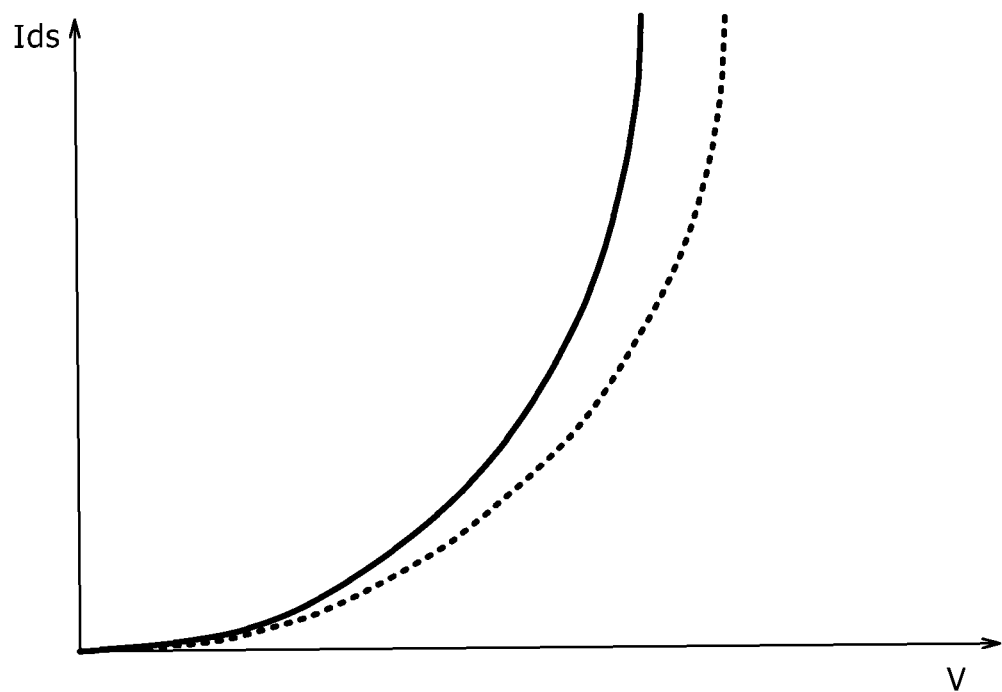

130B

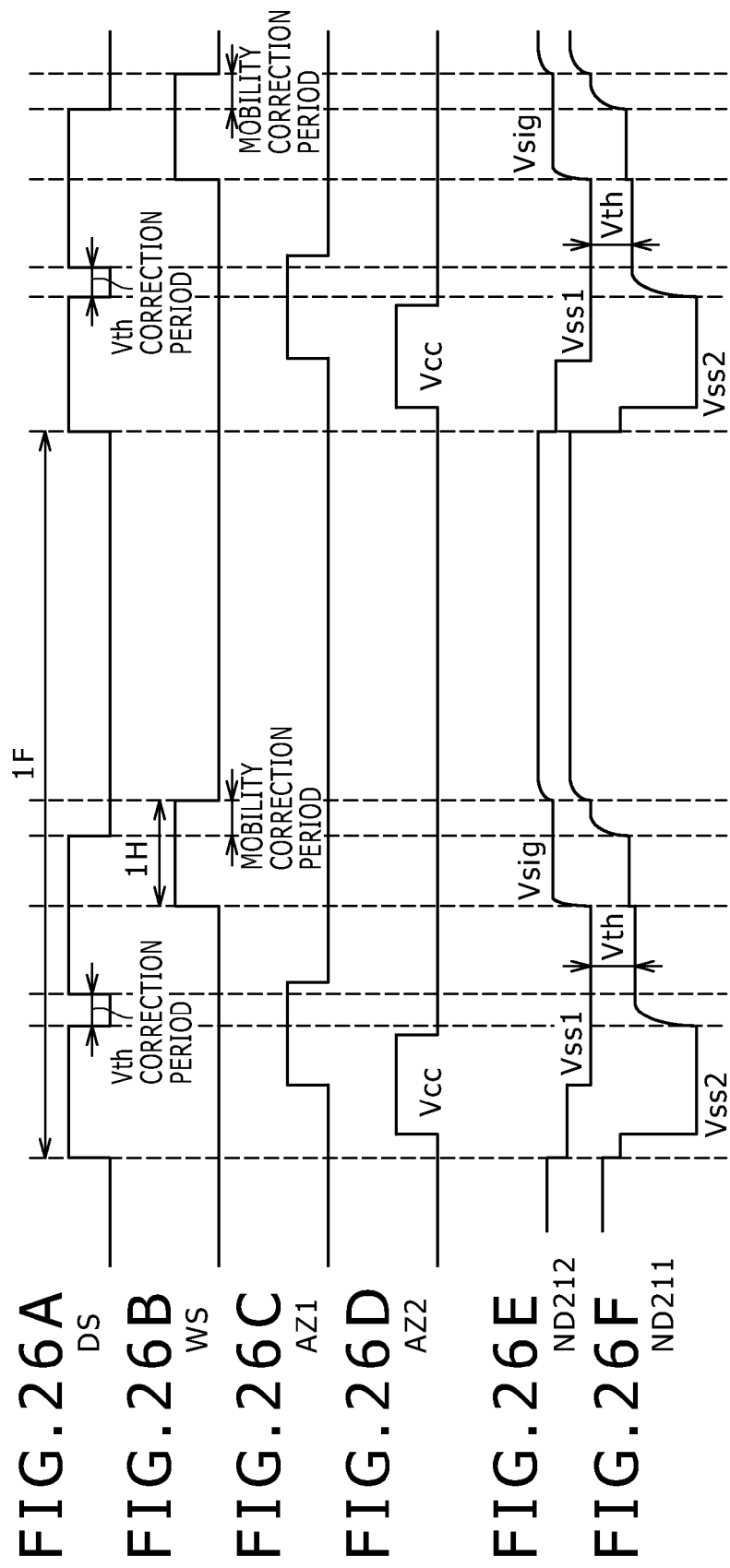

DISPLAY DEVICE

CROSS REFERENCES TO RELATED APPLICATIONS

This is a Continuation of U.S. patent application Ser. No. 13/911,401, filed Jun. 6, 2013, which is a Continuation of U.S. patent application Ser. No. 13/295,948, filed Nov. 14, 2011, now U.S. Pat. No. 8,476,821, issued on Jul. 2, 2013, which is a Divisional application of U.S. patent application Ser. No. 12/000,811, filed Dec. 18, 2007, now U.S. Pat. No. 8,058,795 issued on Nov. 15, 2011, which claims priority from, Japanese Patent Application JP 2007-004278 filed in the Japan Patent Office on Jan. 12, 2007, the entire contents of which are incorporated herein by reference.

BACKGROUND OF THE INVENTION

1. Field of the Invention

The present invention relates to an active matrix type display device including an organic EL (Electroluminescence) light emitting element or the like.

2. Description of the Related Art

In an image display device, for example, a liquid crystal display or the like, a large number of pixels are arranged in the form of a matrix, and light intensity is controlled for each pixel according to information on an image to be displayed, whereby the image is displayed.

While the same is true for an organic EL display or the like, the organic EL display is a so-called emissive display having a light emitting element in each pixel circuit, and it has advantages of providing a higher image viewability, eliminating a need for a backlight, and a having higher response speed, for example, as compared with the liquid crystal display.

In addition, the organic EL display differs greatly from the liquid crystal display or the like in that the luminance of each light emitting element is controlled by the value of a current flowing through the light emitting element, and thereby color gradation is obtained, that is, in that the light emitting element is of a current-controlled type.

As in the liquid crystal display, there are a simple matrix system and an active matrix system as possible driving systems of the organic EL display. The former has a simple structure, but presents problems including, for example, difficulty in realizing a large high-definition display. Therefore, the active matrix system, which controls a current flowing through a light emitting element within each pixel circuit by an active element, or typically a TFT (Thin Film Transistor), provided within the pixel circuit, has been actively developed.

FIG. 1 is a block diagram showing a configuration of an ordinary organic EL display device.

As shown in FIG. 1, this display device 1 includes: a pixel array unit 2 having pixel circuits (PXLC) 2a arranged in the form of a m×n matrix; a horizontal selector (HSEL) 3; a write scanner (WSCN) 4; signal lines (data lines) SGL1 to SGLn selected by the horizontal selector 3 and supplied with a data signal corresponding to luminance information; and scanning lines WSL1 to WSLm selected and driven by the write scanner 4.

Incidentally, the horizontal selector 3 and the write scanner 4 may be formed on polycrystalline silicon, or by a MOSIC or the like on the periphery of the pixels.

FIG. 2 is a circuit diagram showing an example of a configuration of a pixel circuit 2a in FIG. 1 (see U.S. Pat. No. 5,684,365 (Patent Document 1) and Japanese Patent Laid-Open No. Hei 8-234683 (Patent Document 2)).

The pixel circuit of FIG. 2 has the simplest circuit configuration among a large number of circuits that have been proposed, and it is a circuit of a so-called two-transistor driving system.

The pixel circuit 2a of FIG. 2 includes a p-channel thin film field effect transistor (hereinafter referred to as a TFT) 11 and a TFT 12, a capacitor C11, and an organic EL light emitting element (OLED) 13 as a light emitting element. In FIG. 2, SGL denotes a signal line, and WSL denotes a scanning line.

The organic EL light emitting element has a current rectifying property in many cases, and therefore may be referred to as an OLED (Organic Light Emitting Diode). Although the symbol of a diode is used for a light emitting element in FIG. 2 and other figures, the current rectifying property is not necessarily required of an OLED in the following description.

In FIG. 2, the source of the TFT 11 is connected to a power supply potential VCC. The cathode of the light emitting element 13 is connected to a ground potential GND. The operation of the pixel circuit 2a of FIG. 2 is as follows.

Step ST1:

When the scanning line WSL is set in a selected state (a low level in this case), and a writing potential Vdata is applied to the signal line SGL, the TFT 12 conducts to charge or discharge the capacitor C11, and the gate potential of the TFT 11 becomes the writing potential Vdata.

Step ST2:

When the scanning line WSL is set to a non-selected state (a high level in this case), the signal line SGL and the TFT 11 are electrically disconnected from each other. However, the gate potential of the TFT 11 is maintained stably by the capacitor C11.

Step ST3:

A current flowing through the TFT 11 and the light emitting element 13 has a value corresponding to the gate-to-source voltage Vgs of the TFT 11, and the light emitting element 13 continues emitting light at a luminance corresponding to the current value.

An operation of selecting the scanning line WSL and transmitting the luminance information supplied to the data line to the inside of the pixel as in the above-described step ST1 hereinafter will be referred to as "writing".

As described above, once the writing potential Vdata is written in the pixel circuit 2a of FIG. 2, the light emitting element 13 continues emitting light at a constant luminance until the writing potential Vdata is next rewritten.

As described above, in the pixel circuit 2a, the value of the current flowing through the EL light emitting element 13 is controlled by changing the voltage applied to the gate of the TFT 11 as a driving (drive) transistor.

At this time, the source of the p-channel drive transistor is connected to the power supply potential VCC, and the TFT 11 operates in a saturation region at all times. The TFT 11 is therefore a constant-current source having a value expressed by the following Equation 1.

(Equation 1)

$$Ids = 1/2 \cdot \mu(W/L)Cox(Vgs-|Vth|)^2 \qquad (1)$$

where $\mu$ denotes carrier mobility, Cox denotes gate capacitance per unit area, W denotes gate width, L denotes gate length, Vgs denotes the gate-to-source voltage of the TFT 11, and Vth denotes the threshold value of the TFT 11.

Each light emitting element in a simple matrix type image display device emits light only at a moment when the light emitting element is selected. On the other hand, the light emitting element in the active matrix system continues emitting light even after writing is ended, as described above. The active matrix system is therefore advantageous, especially in a large high-definition display, in that the peak luminance and the peak current of the light emitting element can be decreased as compared with the simple matrix system, for example.

FIG. 3 is a diagram showing a secular change in the current-voltage (I-V) characteristic of the organic EL light emitting element. In FIG. 3, a curve represented by a solid line indicates a characteristic at a time of an initial state, and a curve represented by a broken line indicates a characteristic after a secular change.

Generally, as shown in FIG. 3, the I-V characteristic of the organic EL light emitting element is degraded with the passage of time.

However, because the two-transistor driving of FIG. 2 is constant-current driving, a constant current continues flowing through the organic EL light emitting element as described above, and the light emission luminance of the organic EL light emitting element is not degraded with time even when the I-V characteristic of the organic EL light emitting element is degraded.

The pixel circuit 2a of FIG. 2 is formed with p-channel TFTs. When the pixel circuit 2a of FIG. 2 can be formed with n-channel TFTs, an existing amorphous silicon (a-Si) process can be used in TFT fabrication. Thereby, the cost of a TFT substrate can be reduced.

Next, a description will be made of a basic pixel circuit in which the transistors are replaced with re-channel TFTs.

FIG. 4 is a circuit diagram showing a pixel circuit in which the p-channel TFTs in the circuit of FIG. 2 are replaced with n-channel TFTs.

The pixel circuit 2b of FIG. 4 includes n-channel TFTs 21 and 22, a capacitor C21, and an organic EL light emitting element (OLED) 23 as a light emitting element. In FIG. 4, SGL denotes a data line, and WSL denotes a scanning line.

In this pixel circuit 2b, the drain side of the TFT 21 as drive transistor is connected to a power supply potential VCC, and the source of the TFT 21 is connected to the anode of the EL light emitting element 23, whereby a source follower circuit is formed.

FIG. 5 is a diagram showing an operating point of the TFT 21 as a drive transistor and the EL light emitting element 23 in an initial state. In FIG. 5, an axis of abscissas indicates the drain-to-source voltage Vds of the TFT 21, and an axis of ordinates indicates the drain-to-source current Ids of the TFT 21.

As shown in FIG. 5, source voltage is determined by the operating point of the TFT 21 as a drive transistor and the EL light emitting element 23, and the voltage has a different value depending on the gate voltage.

Because the TFT 21 is driven in a saturation region, the TFT 21 passes the current Ids having the current value of the equation shown as the above Equation 1 relating to the gate-to-source voltage Vgs corresponding to the source voltage at the operating point.

The active matrix type organic EL display of the constitution as described above has a laminated structure of a TFT circuit for driving the EL light emitting element and the EL light emitting element as a light emitting layer. Active matrix type organic EL displays of a top emission structure and a bottom emission structure are generally known.

For example, a passive matrix type organic EL element of a top emission structure is disclosed in Japanese Patent Laid-Open No. 2005-203196 (Patent Document 3).

In the case of an ordinary bottom emission structure, a light emission needs to be extracted from a TFT substrate side, and therefore a TFT structure may impose a limitation of EL light emission area=aperture ratio.

In the case of a top emission structure, on the other hand, a light emission needs to be extracted from a counter substrate side. Therefore, the top emission structure is not affected by the TFT structure, so that the EL light emission area=aperture ratio can be increased.

SUMMARY OF THE INVENTION

In the bottom emission structure, light is extracted on a TFT substrate side. It is thus possible to achieve an increase in thickness, that is, a decrease in resistance of an upper electrode (generally a cathode). In addition, because a low-resistance material such as aluminum (Al) or the like can be used, a voltage drop caused by the resistance of the upper electrode relatively does not present a problem.

In the top emission structure, on the other hand, light is extracted on a counter substrate side. A relatively high transmittance in a visible light region is required of an upper electrode (generally a cathode). It is therefore difficult to achieve an increase in thickness, that is, a decrease in resistance of the upper electrode, and use a low-resistance material (=a material having a low transmittance) such as aluminum (Al) or the like.

Hence, in the top emission structure, a voltage drop caused by the resistance of the upper electrode presents a serious problem.

Because of this voltage drop, when a panel is increased in size, the voltage of the upper electrode in a panel plane varies, thus causing a difference in in-plane luminance of the panel.

That is, the larger the size of the panel and the higher the definition of the panel, the greater the effects of these problems.

It is desirable to suppress a voltage drop in an electrode part of a light emitting element, prevent the occurrence of a difference in in-plane luminance of the panel, and thus obtain a picture of high picture quality.

According to a first embodiment of the present invention, there is provided a display device in which pixels, each including an emission area, are arranged in the form of a matrix, the display device including: a first electrode formed from the emission area of the pixels to a non-emission area on a periphery of the emission area; a second electrode formed so as to be common to the pixels; and a light emitting material layer formed between the first electrode and the second electrode; wherein the film thickness in the non-emission area of at least one of the first electrode and the second electrode is larger than film thickness in the emission area.

Preferably, a light emitting part is disposed on a side of a surface in which the second electrode is formed, the second electrode has a laminated structure of a first conductive layer and a second conductive layer in the non-emission area, the first conductive layer has a higher transmittance in a visible light region than the second conductive layer, and the first conductive layer is formed so as to be common to the pixels over an entire area including the emission area and the non-emission area.

Preferably, the second conductive layer has a lower sheet resistance than the first conductive layer.

Preferably, of the first conductive layer and the second conductive layer laminated in the non-emission area, the second conductive layer is formed with a larger film thickness than the first conductive layer, and at least the second conductive layer has a light guiding function for guiding light emitted from the light emitting part in a direction orthogonal to the direction of lamination of the layers.

Preferably, a light emitting part is disposed on a side of a surface in which the first electrode is formed, the first electrode has a laminated structure of a first conductive layer and a second conductive layer in the non-emission area, the first conductive layer has a higher transmittance in a visible light region than the second conductive layer, and the first conductive layer is formed in each pixel including the emission area and the non-emission area.

Preferably, the second conductive layer has a lower sheet resistance than the first conductive layer.

Preferably, the display device is of a top emission type.

Preferably, the display device is of a bottom emission type.

Preferably, each of the pixels includes at least a light emitting element, a driving transistor, and a switching transistor, and the driving transistor and the light emitting element are connected in series with each other between a power supply line and a reference potential.

According to the present invention, for example, the second electrode has the two-layer structure of the first conductive layer and the second conductive layer, the first conductive layer is formed over the entire display area, and the second conductive layer is formed in the non-emission area of the display area, the non-emission area not being the light emitting part. The resistance of the second electrode is thereby reduced.

According to the present invention, it is possible to suppress a voltage drop in the electrode part of the light emitting element, prevent the occurrence of a difference in in-plane luminance of a panel, and thus obtain a picture of high picture quality.

BRIEF DESCRIPTION OF THE DRAWINGS

FIG. 3 is a diagram showing a secular change in the current-voltage (I-V) characteristic of an organic EL light emitting element;

FIGS. 26A, 26B, 26C, 26D, 26E, and 26F are a timing chart of a basic operation of the pixel circuit in FIG. 25.

DETAILED DESCRIPTION OF THE PREFERRED EMBODIMENTS

Preferred embodiments of the present invention will hereinafter be described with reference to the drawings.

Figure 1:
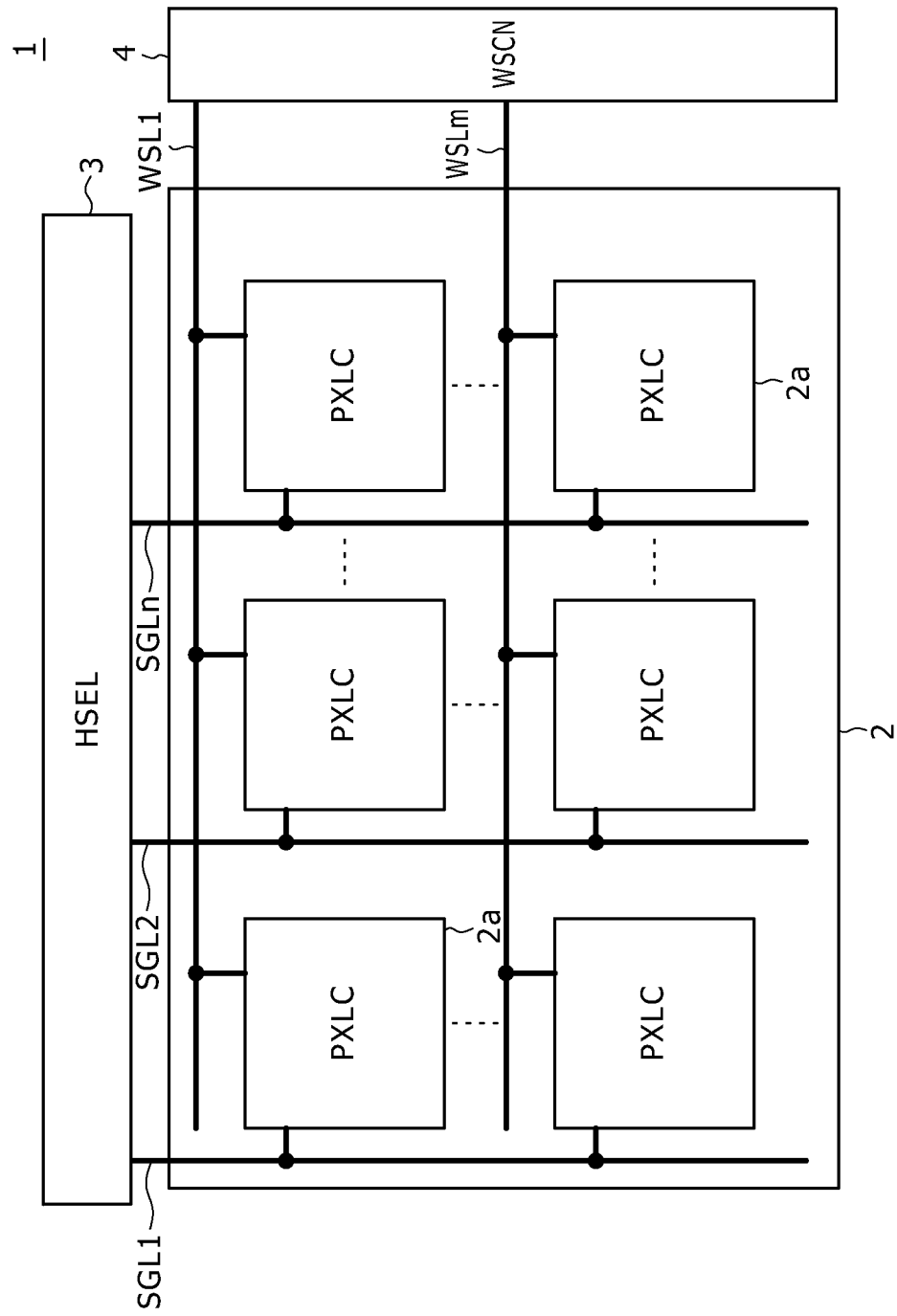
FIG. 1 is a block diagram showing a configuration of an ordinary organic EL display device.
Figure 2:
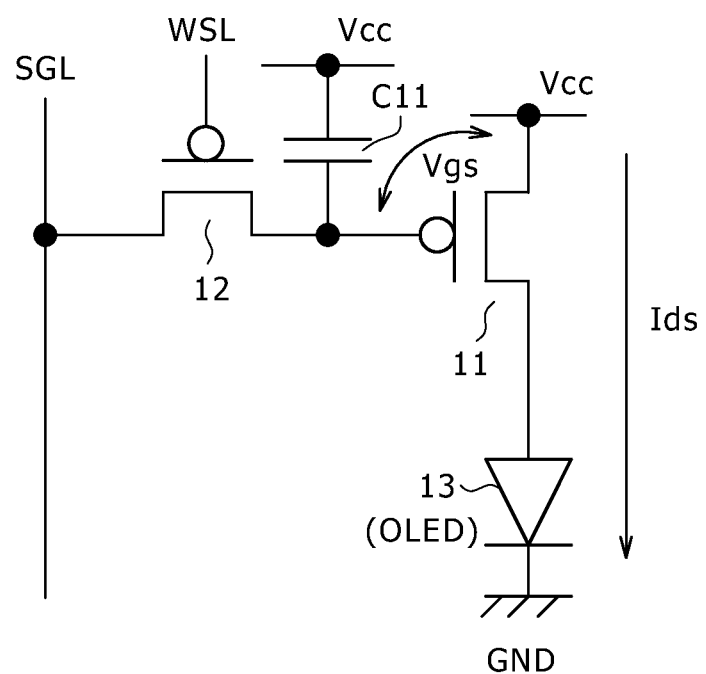
FIG. 2 is a circuit diagram showing an example of a configuration of a pixel circuit in FIG. 1.
Figure 4:
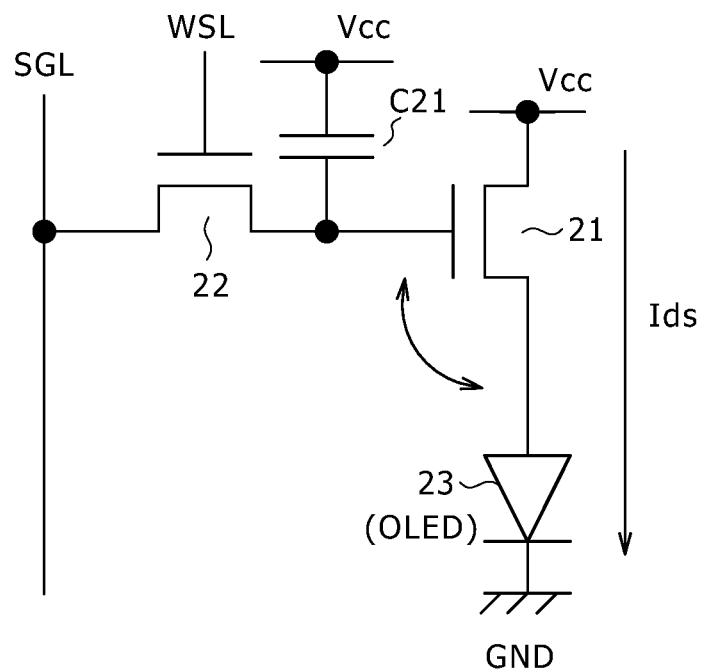
FIG. 4 is a circuit diagram showing a pixel circuit in which p-channel TFTs in the circuit of FIG. 2 are replaced with n-channel TFTs.
Figure 5:
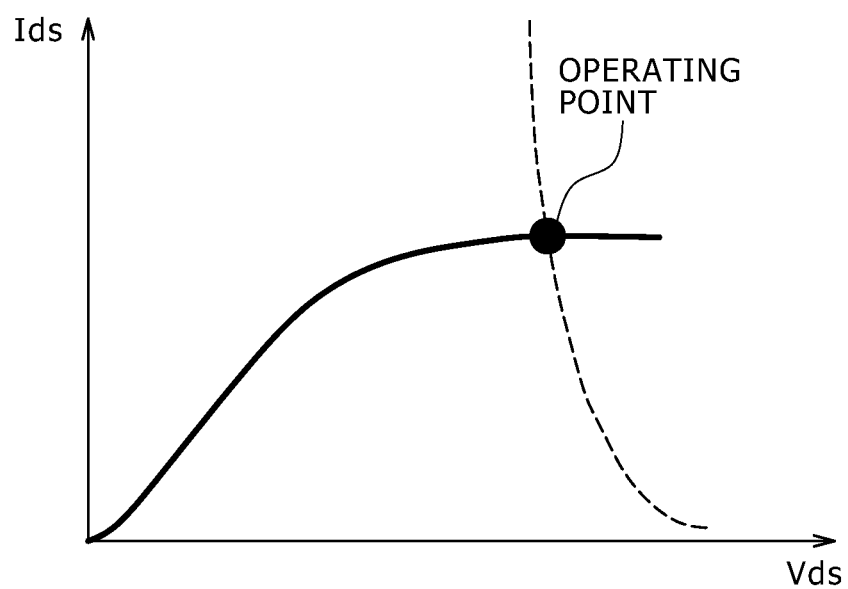
FIG. 5 is a diagram showing an operating point of a TFT as a drive transistor and an EL light emitting element in an initial state.
Figure 6:
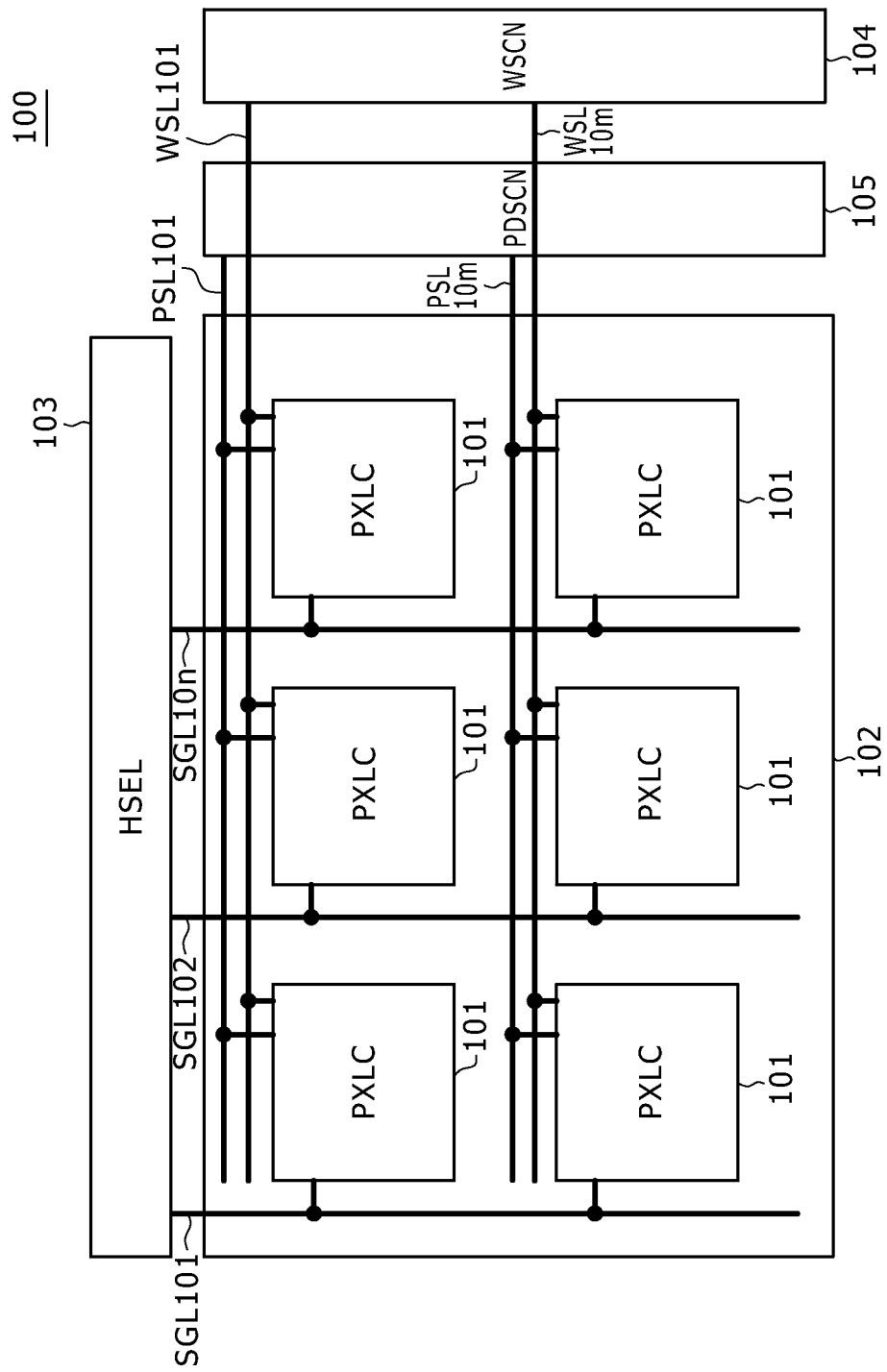
FIG. 6 is a block diagram showing a configuration of an organic EL display device using pixel circuits according to a first embodiment of the present invention.

FIG. 6 is a block diagram showing a configuration of an organic EL display device using pixel circuits according to a first embodiment of the present invention.

Figure 7:
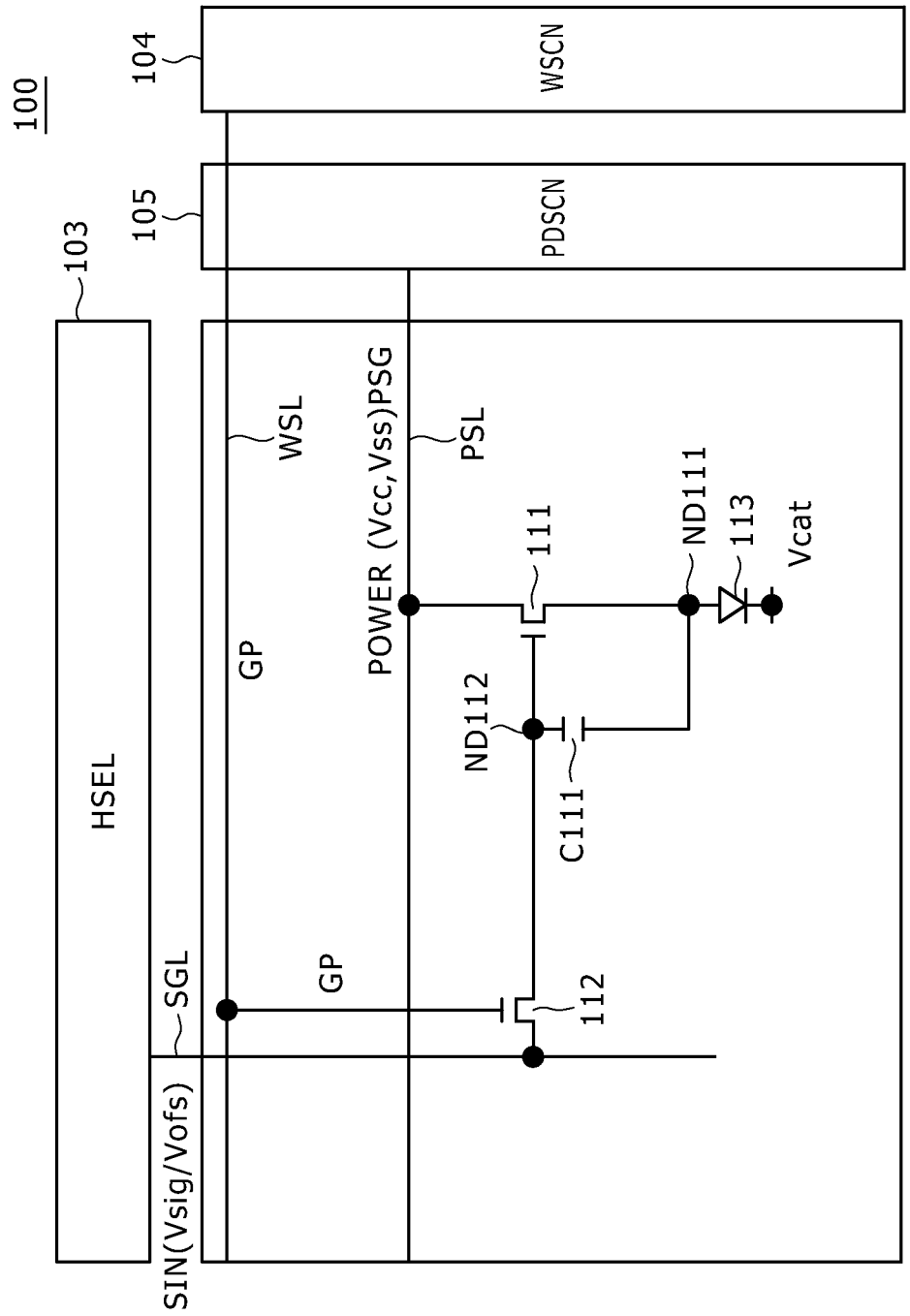
FIG. 7 is a circuit diagram showing a concrete configuration of a pixel circuit according to the first embodiment.

FIG. 7 is a circuit diagram showing a concrete configuration of a pixel circuit according to the first embodiment.

As shown in FIG. 6 and FIG. 7, the display device 100 includes: a pixel array unit 102 having pixel circuits 101 arranged in the form of an m×n matrix; a horizontal selector (HSEL) 103; a write scanner (WSCN) 104; a power drive scanner (PDSCN) 105; signal lines SGL101 to SGL10$n$ selected by the horizontal selector 103 and supplied with an input signal SIN of a data signal Vsig corresponding to luminance information or an offset signal Vofs; scanning lines WSL101 to WSL10$m$ as driving wiring selected and driven by a gate pulse (scanning pulse) GP of the write scanner 104; and power driving lines PSL101 to PSL10$m$ as driving wiring driven by being supplied with a power signal PSG selectively set to a voltage VCC (for example a power supply voltage) or a voltage VSS (for example a negative side voltage) by the power drive scanner 105.

Incidentally, while the pixel circuits 101 are arranged in the form of the m×n matrix in the pixel array unit 102, for simplicity of the figure, FIG. 6 shows an example in which pixel circuits 101 are arranged in the form of a 2 (=m)×3 (=n) matrix.

In addition, for simplicity of the figure, FIG. 7 shows a concrete configuration of one pixel circuit.

As shown in FIG. 7, a pixel circuit 101 according to the present embodiment includes: a n-channel TFT 111 as a driving transistor; a n-channel TFT 112 as a switching transistor; a capacitor C111; a light emitting element 113 formed by an organic EL light emitting element (OLED: an electrooptic element); a first node ND111; and a second node ND112.

In the pixel circuit 101, the TFT 111 as the driving transistor, the node ND111, and the light emitting element (OLED) 113 are connected in series with each other between the power driving line (power supply line) PSL (101 to 10m) and a predetermined reference potential Vcat (for example, a ground potential).

Specifically, the cathode of the light emitting element 113 is connected to the reference potential Vcat. The anode of the light emitting element 113 is connected to the first node ND111. The source of the TFT 111 is connected to the first node ND111. The drain of the TFT 111 is connected to the power driving line PSL.

The gate of the TFT 111 is connected to the second node ND112.

The first electrode of the capacitor C111 is connected to the first node ND111. The second electrode of the capacitor C111 is connected to the second node ND112.

The source and the drain of the TFT 112 are connected between the signal line SGL and the second node ND112, respectively. The gate of the TFT 112 is connected to the scanning line WSL.

Thus, the pixel circuit 101 according to the present embodiment has the capacitor C111 as a pixel capacitance connected between the gate and the source of the TFT 111 as drive transistor.

Figure 8:
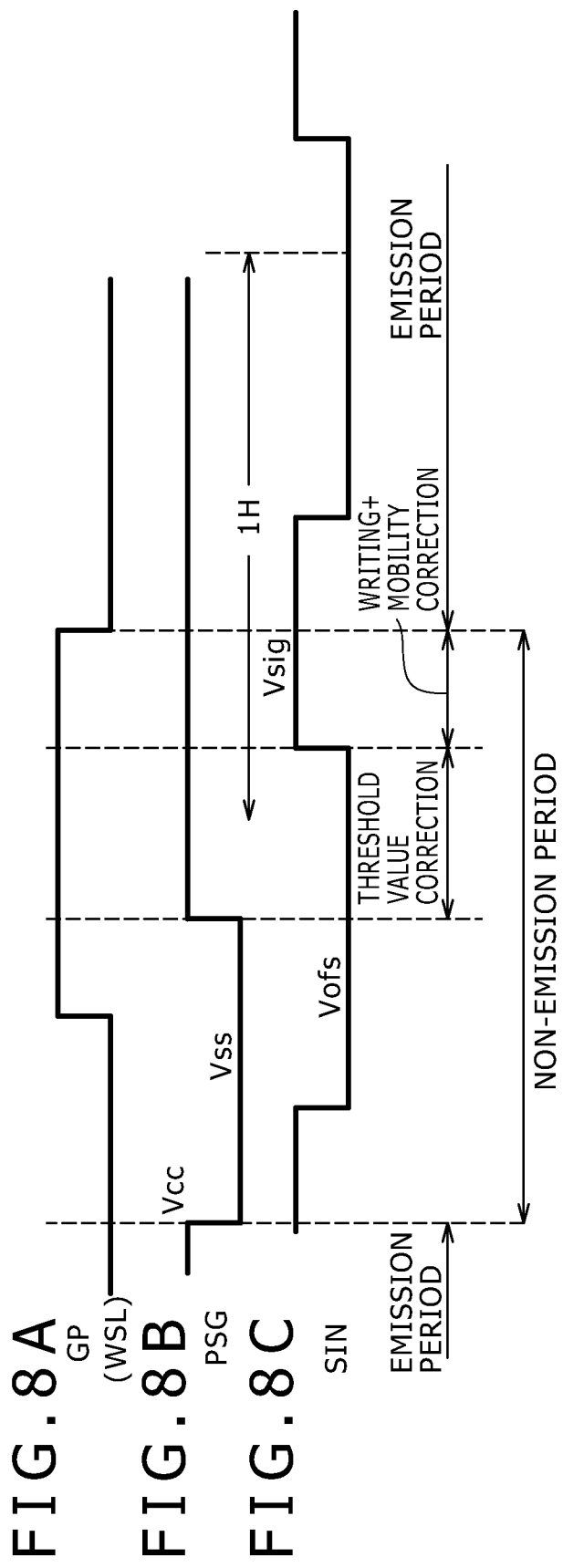
FIGS. 8A, 8B, and 8C are a timing chart showing a basic operation of the pixel circuit in FIG. 7.

FIGS. 8A to 8C are a timing chart showing a basic operation of the pixel circuit in FIG. 7.

FIG. 8A shows the gate pulse (scanning pulse) GP applied to the scanning line WSL. FIG. 8B shows the power signal PSG applied to the power driving line PSL. FIG. 8C shows the input signal SIN applied to the signal line SGL.

For light emission of the light emitting element 113 in the pixel circuit 101, during a non-emission period, as shown in FIGS. 8A to 8C, a power signal VSS (for example, a negative voltage) is applied to the power driving line PSL, and an offset signal Vofs is propagated through the signal line SGL and then input to the second node ND112 via the TFT 112. Thereafter, a power signal VCC (corresponding to a power supply voltage) is applied to the power driving line PSL. Thus, the threshold value of the TFT 111 is corrected.

Thereafter, a data signal Vsig corresponding to luminance information is applied to the signal line SGL, whereby the signal is written to the second node ND112 via the TFT 112. At this time, the writing is performed while a current is passed through the TFT 111, so that mobility correction is performed in a simultaneous and parallel manner.

Then, the TFT 112 is set in a non-conducting state, and the light emitting element 113 is made to emit light according to the luminance information.

The active matrix type organic EL display device 100 having the constitution as described above has a laminated structure of a TFT circuit for driving the EL light emitting element and the EL light emitting element as a light emitting layer, and is fabricated as a display device of a top emission structure or a bottom emission structure.

In the display device 100 according to the present embodiment, the following measures are taken to remedy the occurrence of a difference in in-plane luminance of a panel due to a voltage drop in an electrode part of the light emitting element, that is, to improve picture quality and the like by reducing the resistance of a first electrode (for example an anode electrode) or a second electrode (for example a cathode electrode) formed so as to sandwich a light emitting element material layer of the light emitting element 113 in the top emission structure or the bottom emission structure.

Figure 9:
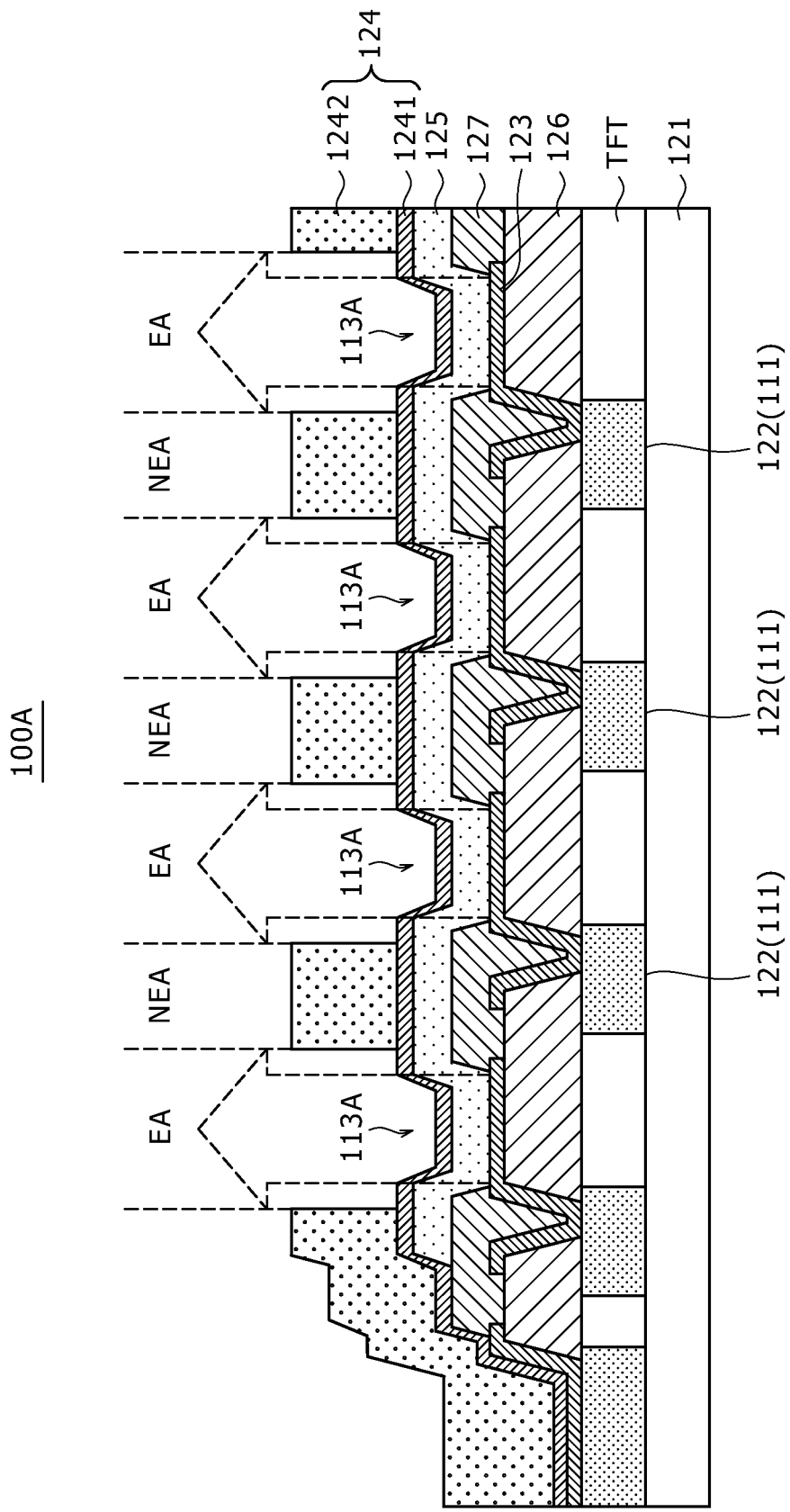
FIG. 9 is a diagram of assistance in explaining an example of a first measure to improve picture quality and the like, and is a schematic sectional view of principal parts of a top emission structure.

FIG. 9 is a diagram of assistance in explaining an example of a first measure to improve the picture quality and the like, and is a schematic sectional view of principal parts of a top emission structure.

As shown in FIG. 9, a display device 100A having the top emission structure includes: a substrate 121 formed by a glass, for example; a plurality of TFTs 122 (the TFT 111 in FIG. 7) formed on the substrate 121 for each of pixel circuits 101; an anode electrode layer 123 as a first electrode formed over an area from an emission area EA of each of the pixel circuits 101 to a non-emission area NEA on the periphery of the emission area EA, the anode electrode layer 123 being connected to the TFT 122 (the source of the TFT 111) in the non-emission area NEA; a cathode electrode layer 124 as a second electrode formed over an entire area so as to be common to pixels; and a light emitting material layer (EL layer) 125 formed over the entire area between the anode electrode layer 123 and the cathode electrode layer 124.

The cathode electrode layer 124 as the second electrode has a laminated structure of a first conductive layer 1241 and a second conductive layer 1242 in the non-emission area NEA of each of the pixel circuits 101. Only the first conductive layer 1241 is formed over the entire area including the emission areas EA and the non-emission areas NEA in such a manner as to be common to the pixels.

References 126 and 127 in FIG. 9 denote an insulating film.

In addition, the first conductive layer 1241 is formed by a layer having a higher transmittance in a visible light region than the second conductive layer 1242.

For example, the first conductive layer 1241 is formed by a transparent electrode of ITO or the like. The second conductive layer 1242 is desirably formed by a low-resistance material. For example, the low-resistance material is desirably a metal such as Al, Ag, Cu or the like or an alloy including one or more of the metals.

The anode electrode layer 123 is formed by a material such as Al or the like.

In the case of the structure of FIG. 9, the cathode electrode layer 124 as the second electrode is constructed by forming the first conductive layer 1241 on the EL layer 125 after the EL layer 125 is formed, and then selectively forming the second conductive layer 1242 in the non-emission areas NEA.

Figure 10:
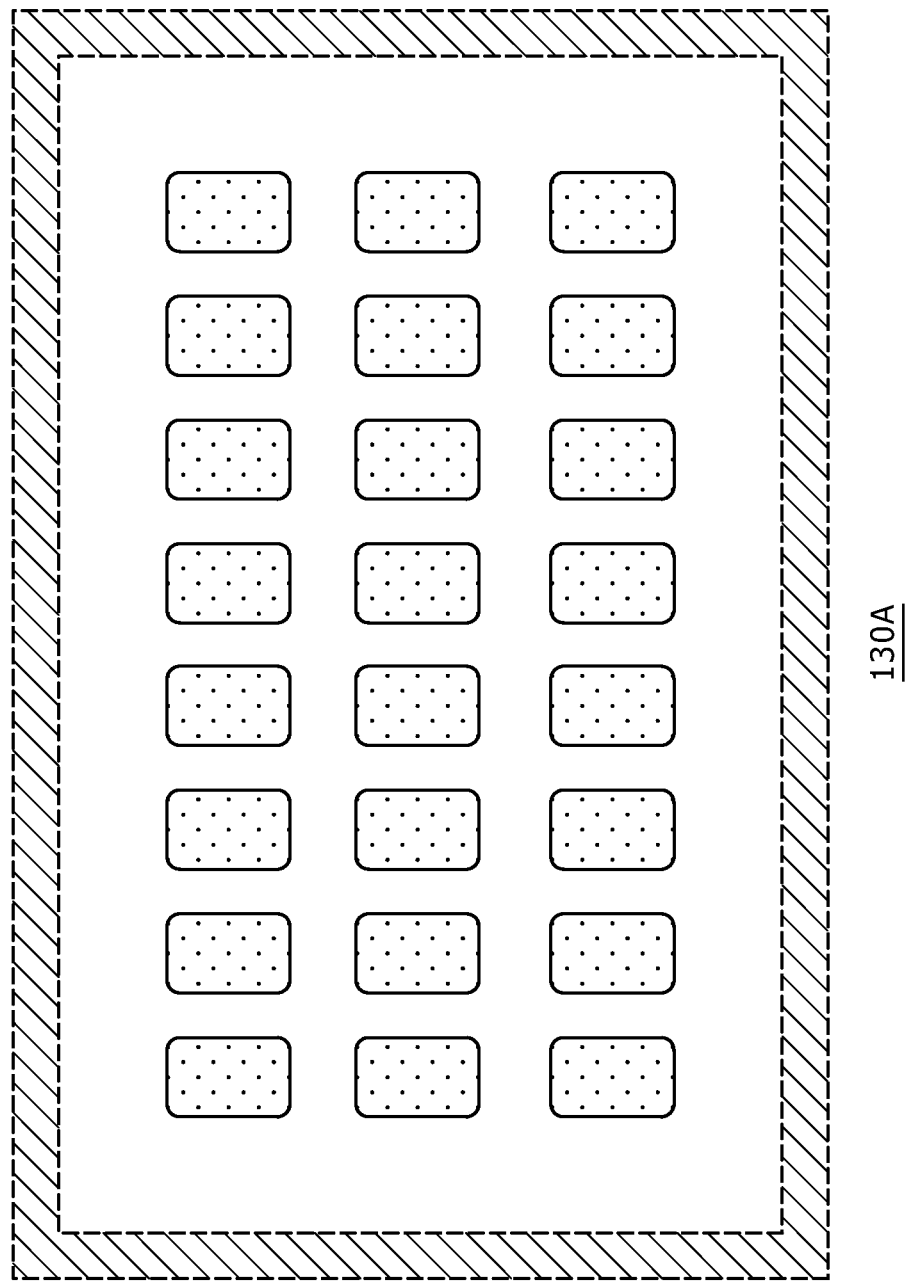
FIG. 10 is a diagram showing an example of an evaporation mask for a first conductive layer.
Figure 11:
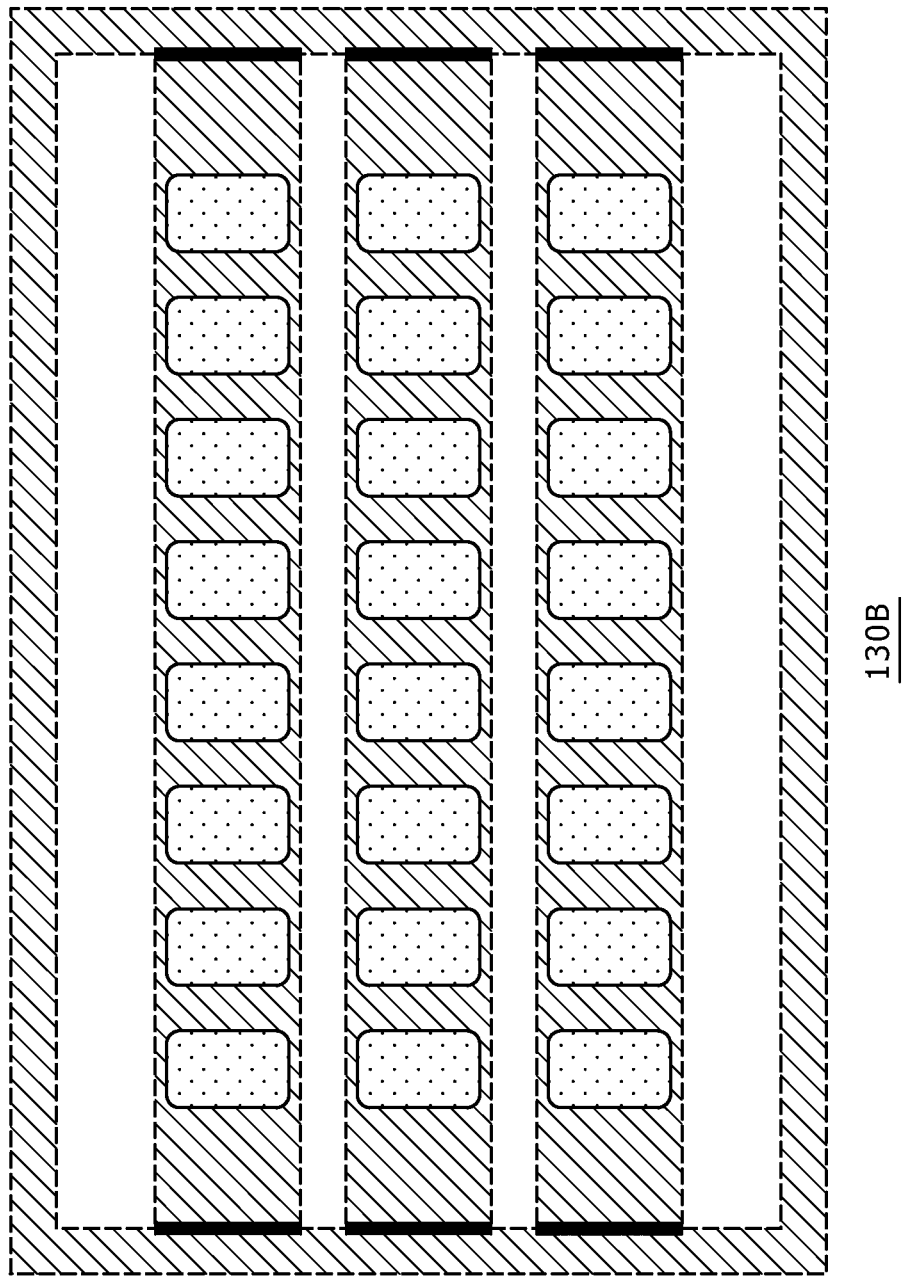
FIG. 11 is a diagram showing an example of an evaporation mask for a second conductive layer.

In this case, evaporation films 130A and 130B as shown in FIG. 10 and FIG. 11 are used.

The second conductive layer 1242 in the cathode electrode layer 124 as the second electrode has a lower sheet resistance than the first conductive layer 1241.

Of the first conductive layer 1241 and the second conductive layer 1242 laminated in the non-emission areas NEA, the second conductive layer 1242 is formed with a larger film thickness than the first conductive layer 1241. At least the second conductive layer 1242 has a light guiding function for guiding light emitted from a light emitting part 113A of an EL light emitting element 113 in a direction orthogonal to the direction of lamination of the layers (the direction of a normal to the principal plane of the substrate 121).

For example, the first conductive layer 1241 is formed with a film thickness on the order of nanometers, and the second conductive layer 1242 is formed with a film thickness on the order of micrometers.

In the present embodiment, because the second conductive layer 1242 is formed by a material having a high reflectance, such as Al or the like, a part of the light emitted from the light emitting part 113A is guided upward in FIG. 9 while reflected on the side parts of the second conductive layer 1242.

This light guiding function enables the emitted light to be extracted efficiently.

Thus, the display device 100A having the top emission structure of FIG. 9 achieves a low resistance of the cathode electrode layer 124. It is therefore possible to suppress a voltage drop in the electrode part of the light emitting element, prevent the occurrence of a difference in in-plane luminance of a panel, and thus obtain a picture of high picture quality.

Figure 12:
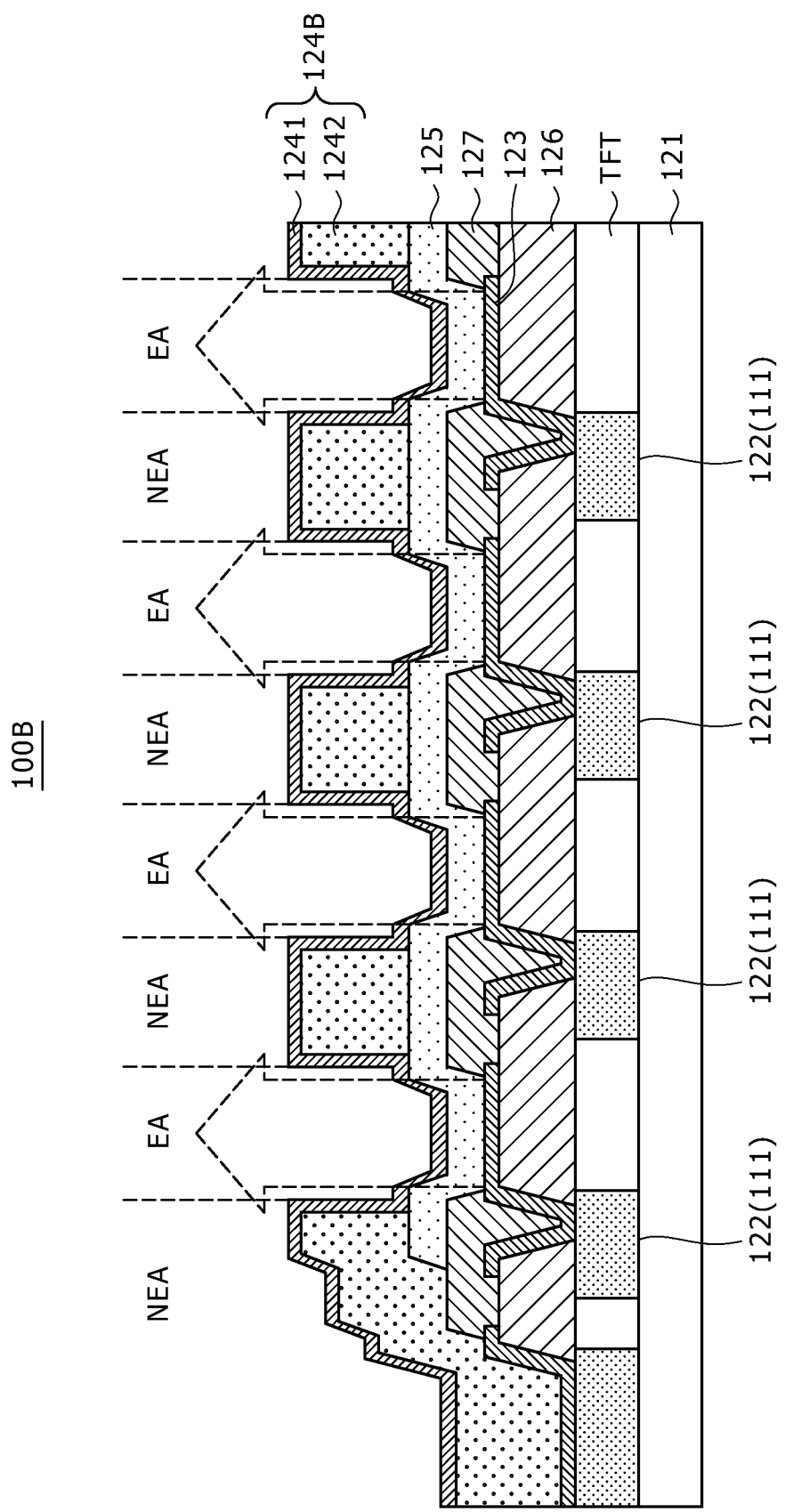
FIG. 12 is a diagram of assistance in explaining an example of a second measure to improve picture quality and the like, and is a schematic sectional view of principal parts of another top emission structure.

FIG. 12 is a diagram of assistance in explaining an example of a second measure to improve picture quality and the like, and is a schematic sectional view of principal parts of a top emission structure.

A display device 100B in FIG. 12 is different from the display device 100A in FIG. 9 in that the first conductive layer 1241 and the second conductive layer 1242 of a cathode electrode layer 124B are laminated in a different order.

Specifically, in the display device 100B of FIG. 12, the second conductive layer 1242 is selectively formed in the non-emission area NEA of each of pixel circuits 101, and the first conductive layer 1241 is thereafter formed over an entire area in such a manner as to be common to pixels. The first conductive layer 1241 is an upper layer over the second conductive layer 1242.

Also, in this constitution, because the second conductive layer 1242 is formed by a material having a high reflectance, such as Al or the like, even when there is light passing through the semitransparent first conductive layer 1241, for example, the part of the light emitted from a light emitting part 113A is guided upward in FIG. 12 while reflected on the side parts of the second conductive layer 1242.

This light guiding function enables the emitted light to be extracted efficiently.

Thus, the display device 100B having the top emission structure of FIG. 12 achieves a low resistance of the cathode electrode layer 124B. It is therefore possible to suppress a voltage drop in the electrode part of a light emitting element, prevent the occurrence of a difference in in-plane luminance of a panel, and thus obtain a picture of high picture quality.

Figure 13:
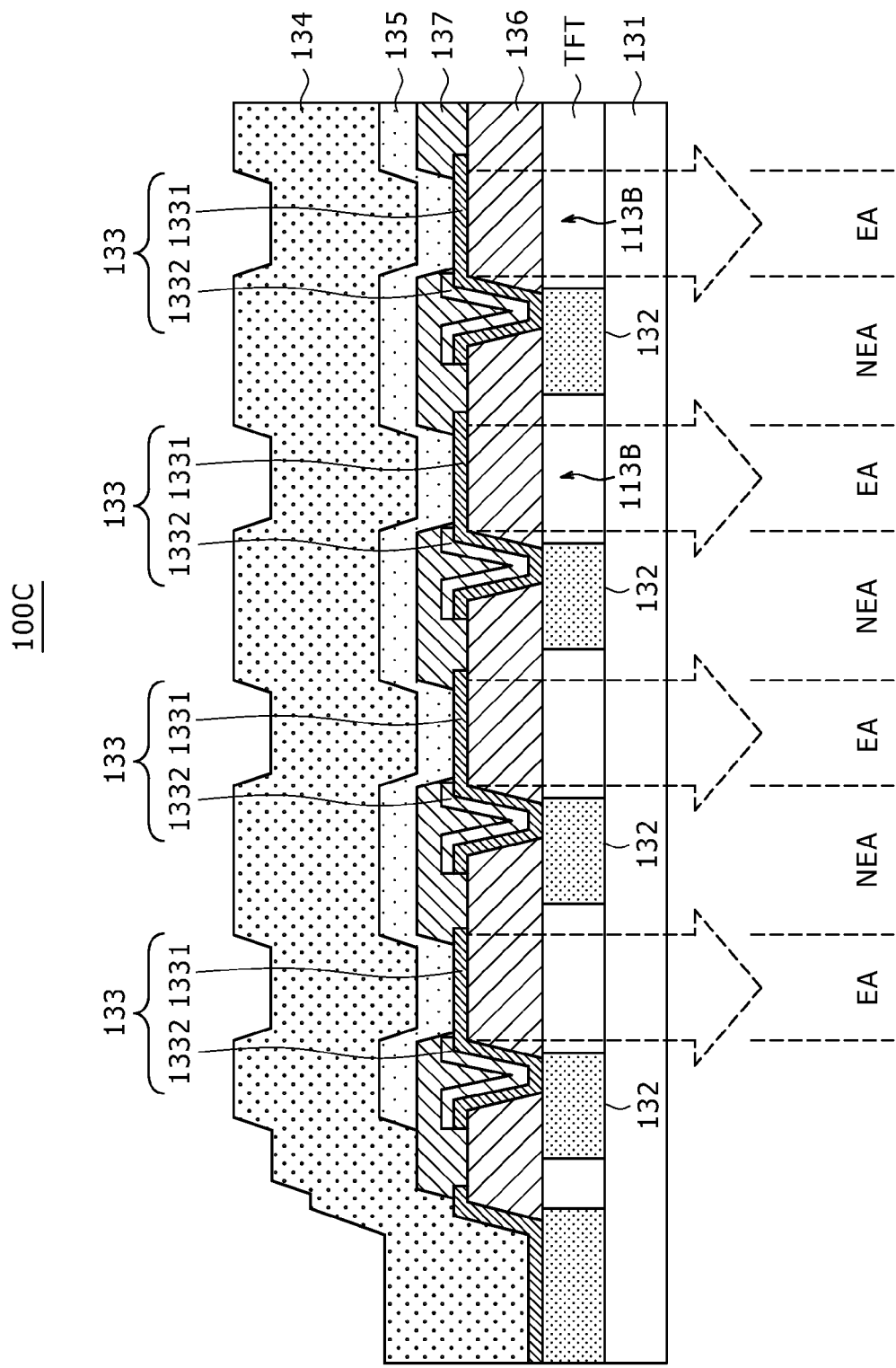
FIG. 13 is a diagram of assistance in explaining an example of a third measure to improve picture quality and the like, and is a schematic sectional view of principal parts of a bottom emission structure.

FIG. 13 is a diagram of assistance in explaining an example of a third measure to improve picture quality and the like, and is a schematic sectional view of the principal parts of a bottom emission structure.

As shown in FIG. 13, a display device 100C having the bottom emission structure includes: a transparent substrate 131 formed by a glass, for example; a plurality of TFTs 132 (the TFT 111 in FIG. 7) formed on the substrate 131 for each of pixel circuits 101; an anode electrode layer 133 as a first electrode formed over an area from an emission area EA of each of the pixel circuits 101 to a non-emission area NEA on the periphery of the emission area EA, the anode electrode layer 133 being connected to the TFT 132 (the source of the TFT 111) in the non-emission area NEA; a cathode electrode layer 134 as a second electrode formed over an entire area so as to be common to pixels; and a light emitting material layer (EL layer) 135 formed over the entire area between the anode electrode layer 133 and the cathode electrode layer 134.

The anode electrode layer 133 as the first electrode has a laminated structure of a first conductive layer 1331 and a second conductive layer 1332 in the non-emission area NEA of each of the pixel circuits 101. Only the first conductive layer 1331 is formed in both the emission area EA and the non-emission area NEA of each pixel.

References 136 and 137 in FIG. 13 denote an insulating film.

In addition, the first conductive layer 1331 is formed by a layer having a higher transmittance in a visible light region than the second conductive layer 1332.

For example, the first conductive layer 1331 is formed by a transparent electrode of ITO or the like. The second conductive layer 1332 is desirably formed by a low-resistance material. For example, the low-resistance material is desirably a metal such as Al, Ag, Cu or the like or an alloy including one or more of the metals.

The cathode electrode layer 134 is formed by a material such as Al or the like.

In the case of the structure of FIG. 13, the anode electrode layer 133 as the first electrode is constructed by forming the first conductive layer 1331 connected to the TFTs 132 and then selectively forming the second conductive layer 1332 in the non-emission areas NEA.

The second conductive layer 1332 in the anode electrode layer 133 as the first electrode has a lower sheet resistance than the first conductive layer 1331.

Thus, the display device 100C having the bottom emission structure of FIG. 13 achieves a low resistance of the anode electrode layer 133. It is therefore possible to suppress a voltage drop in the electrode part of the light emitting element, prevent the occurrence of a difference in in-plane luminance of a panel, and thus obtain a picture of high picture quality.

Figure 14:
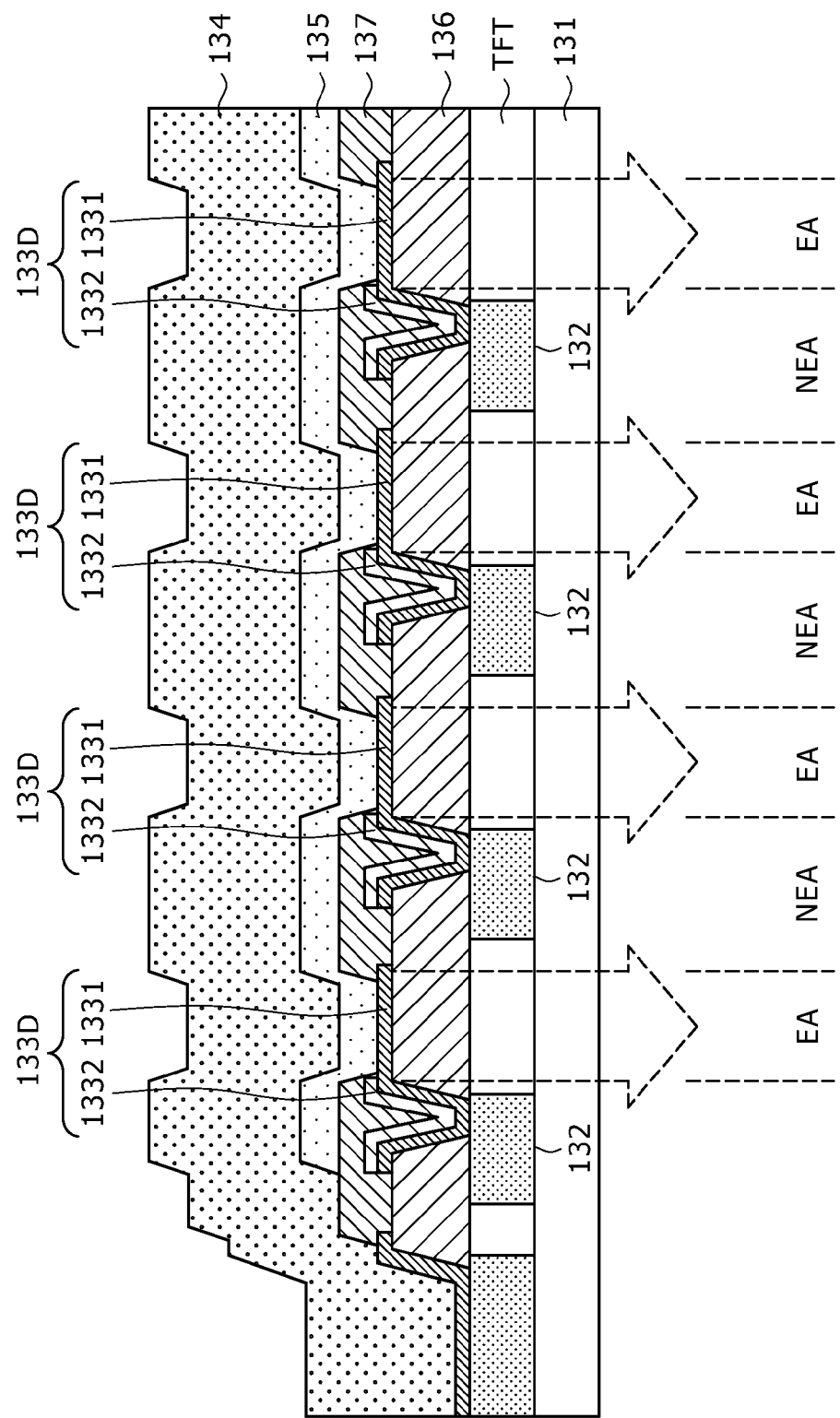
FIG. 14 is a diagram of assistance in explaining an example of a fourth measure to improve picture quality and the like, and is a schematic sectional view of principal parts of another bottom emission structure.

FIG. 14 is a diagram of assistance in explaining an example of a fourth measure to improve picture quality and the like, and is a schematic sectional view of principal parts of a bottom emission structure.

A display device 100D in FIG. 14 is different from the display device 100C in FIG. 13 in that the first conductive layer 1331 and the second conductive layer 1332 of an anode electrode layer 133D are laminated in a different order.

Specifically, in the display device 100D of FIG. 14, the second conductive layer 1332 is selectively formed in the non-emission area NEA of each of pixel circuits 101, and the first conductive layer 1331 is thereafter formed over an area from the non-emission area NEA to an emission area EA. The first conductive layer 1331 is an upper layer over the second conductive layer 1332.

Thus, the display device 100D having the bottom emission structure of FIG. 14 achieves a low resistance of the anode electrode layer 133D. It is therefore possible to suppress a voltage drop in the electrode part of a light emitting element, prevent the occurrence of a difference in in-plane luminance of a panel, and thus obtain a picture of high picture quality.

A more concrete operation of the above-described constitution will be described next by centering on the operation of the pixel circuit with reference to FIGS. 15A to 15E and FIGS. 16 to 23.

Figure 15:
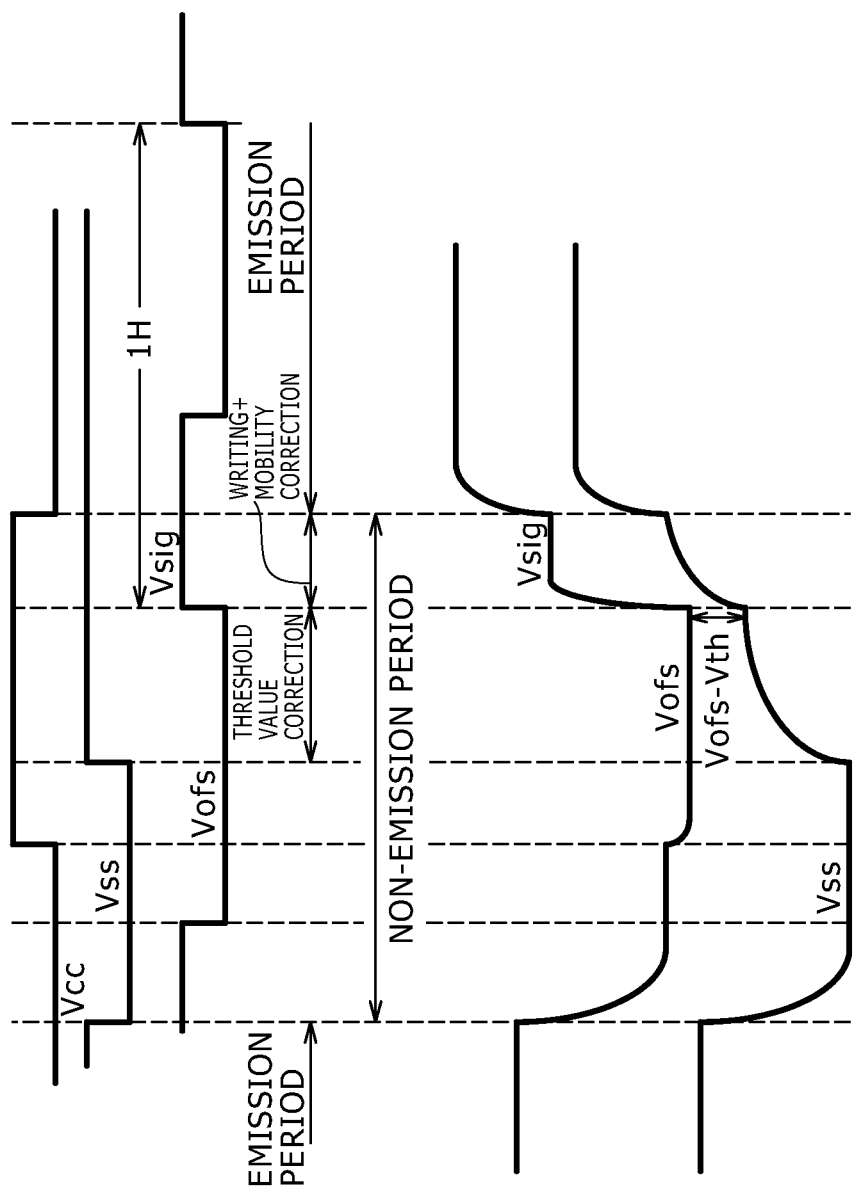
FIGS. 15A, 15B, 15C, 15D, and 15E are a timing chart of a concrete operation of the pixel circuit in FIG. 7.

FIG. 15A shows a gate pulse (scanning pulse) GP applied to the scanning line WSL. FIG. 15B shows a power signal PSG applied to the power driving line PSL. FIG. 15C shows an input signal SIN applied to the signal line SGL. FIG. 15D shows the potential VND112 of the second node ND112. FIG. 15E shows the potential VND111 of the first node ND111.

Figure 16:
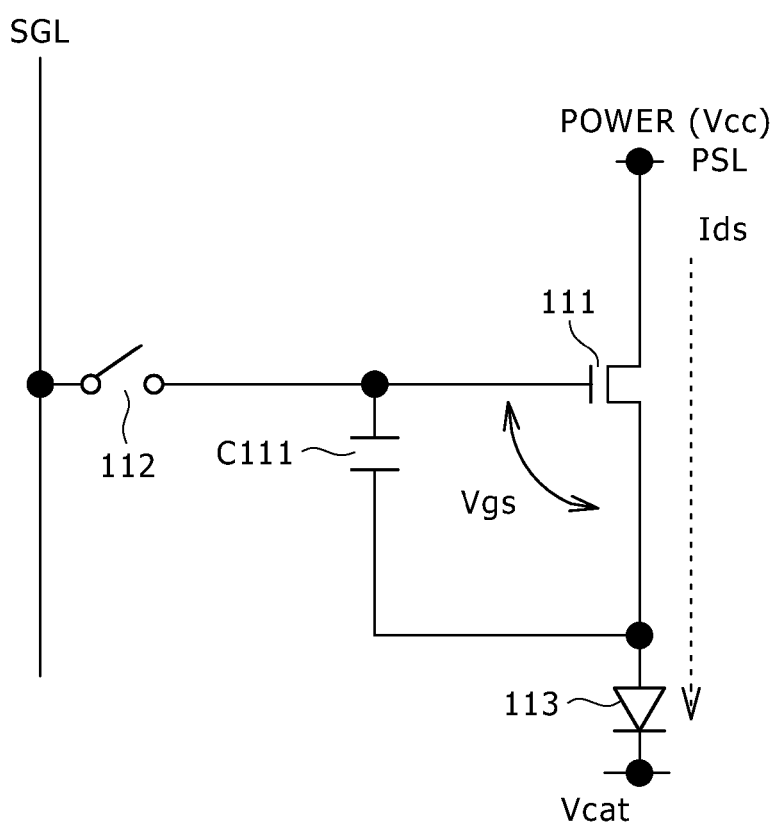
FIG. 16 is a diagram of assistance in explaining the operation of the pixel circuit in FIG. 7, and is a diagram showing a state during an emission period.

First, during a light emitting state of the light emitting element 113, as shown in FIG. 15B and FIG. 16, the power driving line PSL is at a power supply voltage VCC, and the TFT 112 is in an off state.

At this time, because the TFT 111 as a driving transistor is set to operate in a saturation region, a current Ids flowing through the EL light emitting element 113 assumes a value expressed by Equation 1 according to the gate-to-source voltage Vgs of the TFT 111.

Figure 17:
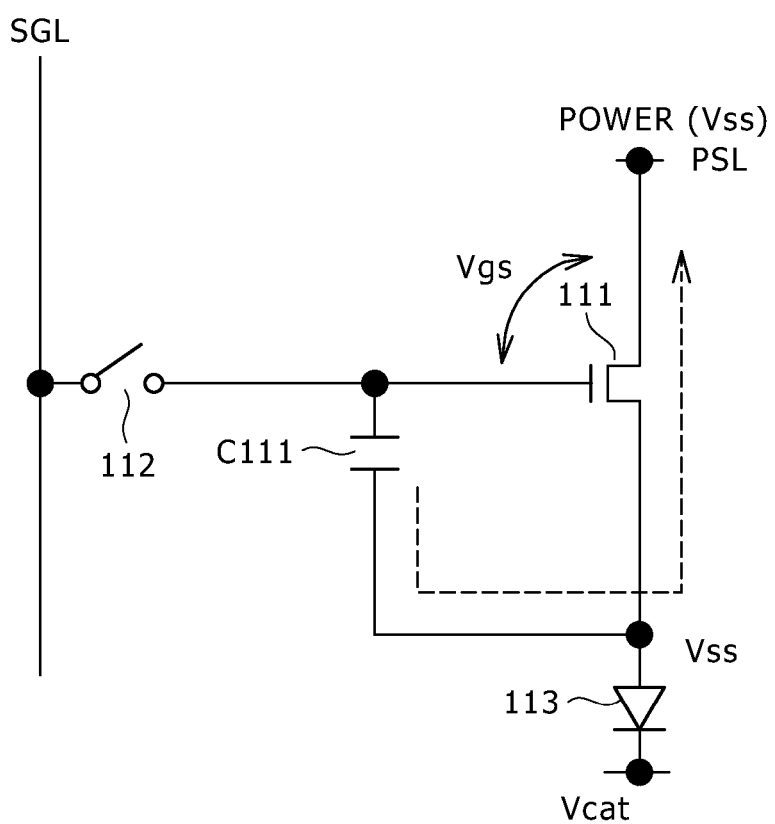
FIG. 17 is a diagram of assistance in explaining the operation of the pixel circuit in FIG. 7, and is a diagram showing a state in which a voltage Vss is set during a non-emission period.
Figure 18:
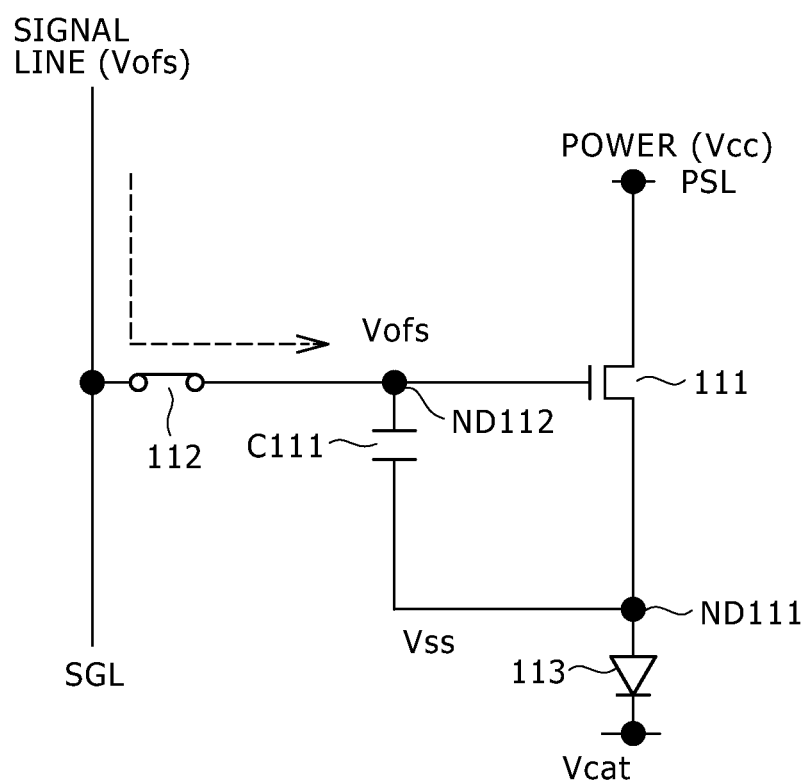
FIG. 18 is a diagram of assistance in explaining the operation of the pixel circuit in FIG. 7, and is a diagram showing a state in which an offset signal is input.

Next, in a non-emission period, as shown in FIG. 15B and FIG. 17, the power driving line PSL as a power supply line is set at a voltage Vss. At this time, when the voltage Vss is lower than the sum of the threshold value Vthel of the EL light emitting element 113 and a cathode voltage Vcat, that is, Vss<Vthel+Vcat, the EL light emitting element 113 is quenched, and the power driving line PSL as a power supply line becomes the source of the TFT 111 as a driving transistor. At this time, as shown in FIG. 15E, the anode (node ND111) of the EL light emitting element 113 is charged to the voltage Vss.

Further, as shown in FIGS. 15A, 15C, 15D, and 15E and FIG. 18, when the potential of the signal line SGL becomes an offset voltage Vofs, the gate pulse GP is set at a high level to turn on the TFT 112, whereby the gate potential of the TFT 111 is set at the offset voltage Vofs.

At this time, the gate-to-source voltage of the TFT 111 assumes a value (Vofs−Vss). A threshold value correcting operation cannot be performed when the gate-to-source voltage (Vofs−Vss) of the TFT 111 is not higher than (is lower than) the threshold voltage Vth of the TFT 111. It is therefore necessary that the gate-to-source voltage (Vofs−Vss) of the TFT 111 be higher than the threshold voltage Vth of the TFT 111, that is, Vofs−Vss>Vth.

Then, the power signal PSG applied to the power driving line PSL in the threshold value correcting operation is set at the power supply voltage Vcc again.

Figure 19:
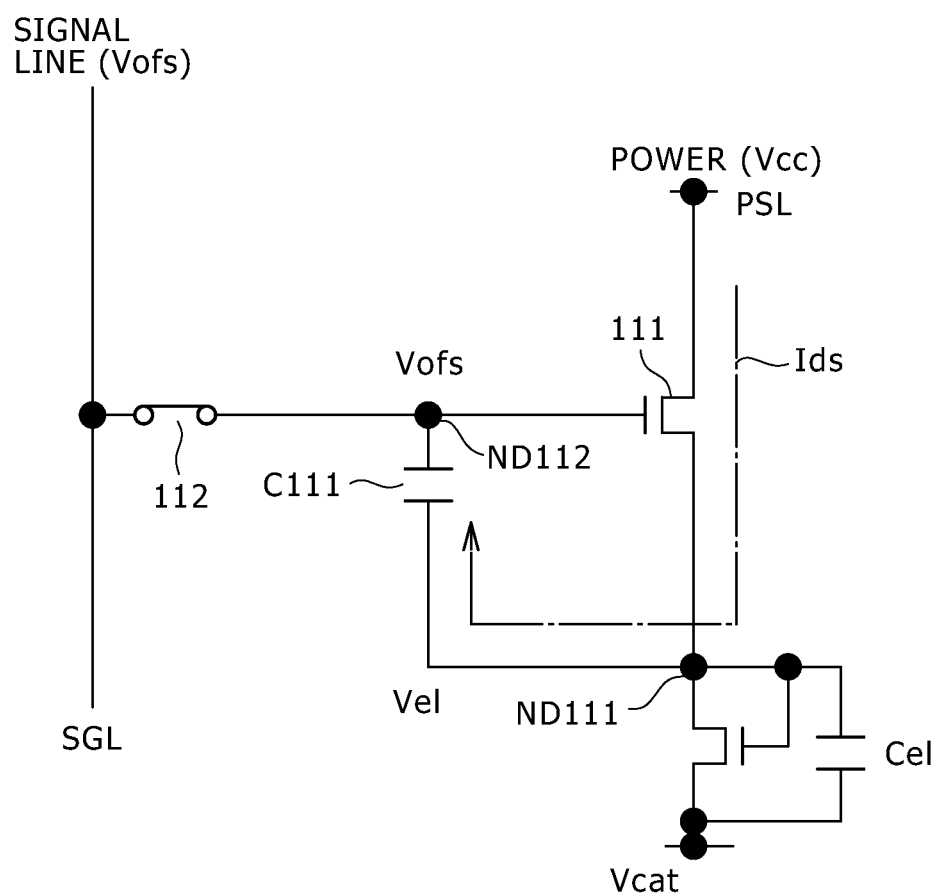
FIG. 19 is a diagram of assistance in explaining the operation of the pixel circuit in FIG. 7, and is a diagram showing a state in which a voltage Vcc is set.

By setting the power driving line PSL at the power supply voltage Vcc, the anode (node ND111) of the EL light emitting element 113 functions as the source of the TFT 111, and a current flows as shown in FIG. 19.

An equivalent circuit of the EL light emitting element 113 is represented by a diode and a capacitance as shown in FIG. 19. Thus, as long as a relation Vel Vcat+Vthel (a leakage current of the EL light emitting element 113 is considerably smaller than the current flowing through the TFT 111) is satisfied, the current of the TFT 111 is used to charge the capacitors C111 and Cel.

Figure 20:
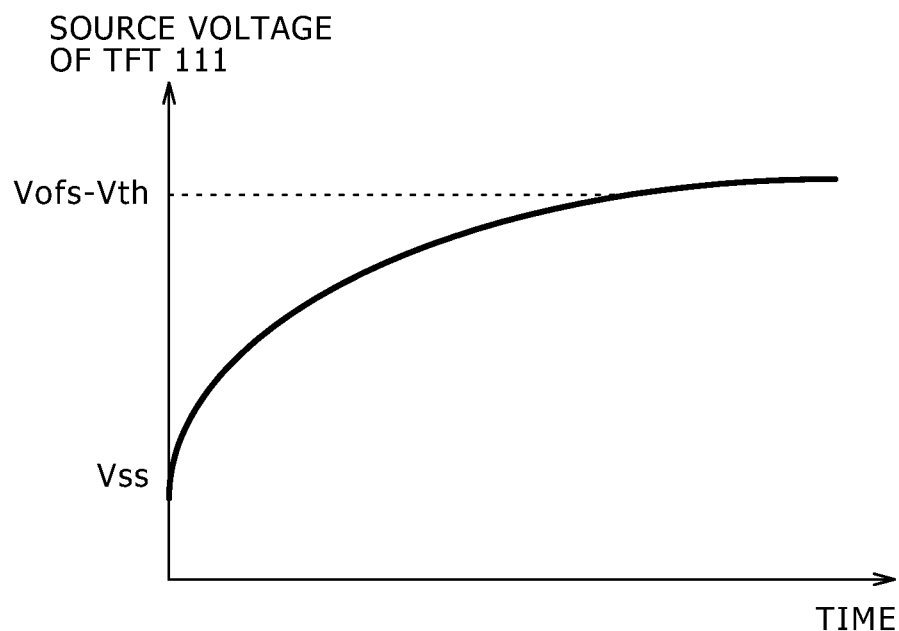
FIG. 20 is a diagram of assistance in explaining the operation of the pixel circuit in FIG. 7, and is a diagram showing a transition of source voltage of a driving transistor when the voltage Vcc is set.

At this time, the voltage Vel across the capacitance Cel rises with time, as shown in FIG. 20. After the passage of a certain time, the gate-to-source voltage of the TFT 111 assumes the value Vth. At this time, Vel=Vofs−Vth≤Vcat+Vthel.

Figure 21:
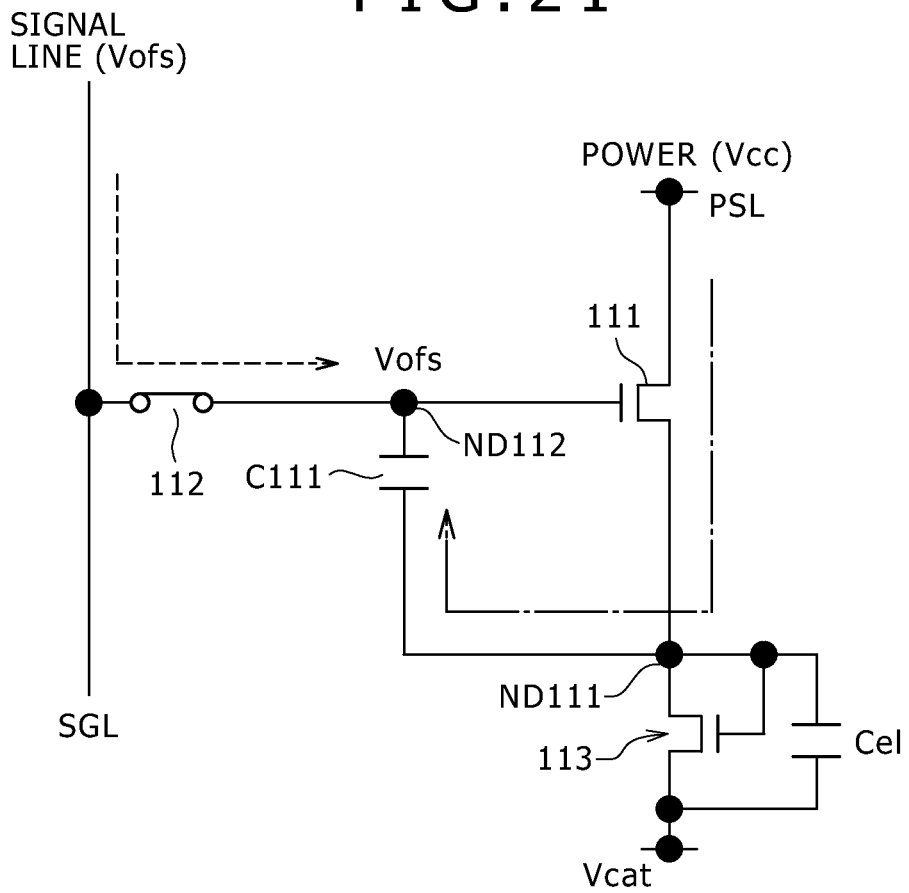
FIG. 21 is a diagram of assistance in explaining the operation of the pixel circuit in FIG. 7, and is a diagram showing a state when a data signal Vsig is written.

After the threshold value canceling operation is ended, as shown in FIGS. 15A and 15C and FIG. 21, the signal line SGL is set at a potential Vsig with the TFT 112 in an on state. The data signal Vsig is a voltage corresponding to a gradation. At this time, as shown in FIG. 15D, the gate potential of the TFT 111 is the potential Vsig because the TFT 112 is on. The source potential rises with time because the current Ids flows from the power driving line PSL as a power supply line.

At this time, when the source voltage of the TFT 111 does not exceed the sum of the threshold voltage Vthel of the EL light emitting element 113 and the cathode voltage Vcat (when the leakage current of the EL light emitting element 113 is considerably smaller than the current flowing through the TFT 111), the current flowing through the TFT 111 is used to charge the capacitors C111 and Cel.

At this time, because the operation of correcting the threshold value of the TFT 111 has been completed, the current passed by the TFT 111 reflects a mobility μ.

Figure 22:
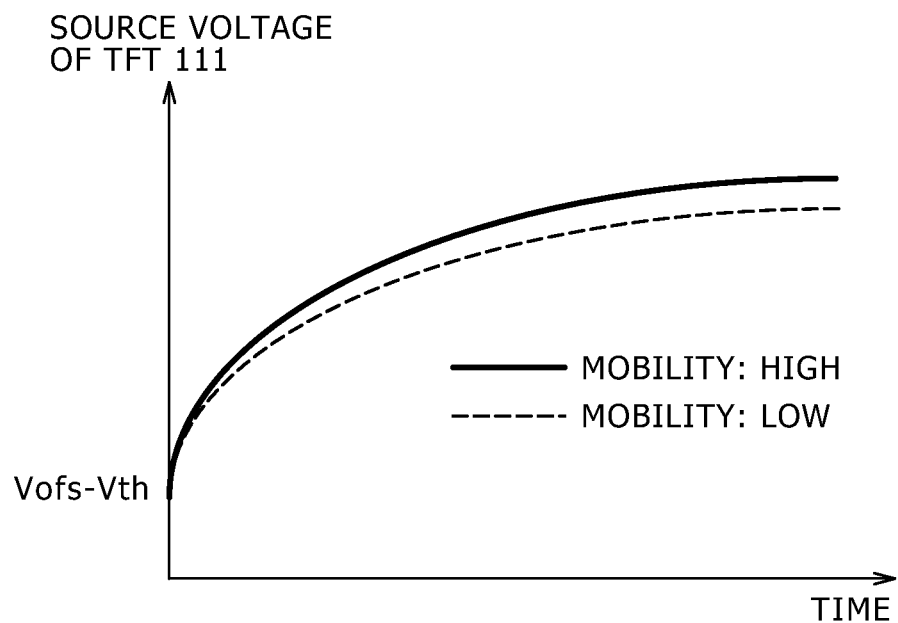
FIG. 22 is a diagram of assistance in explaining the operation of the pixel circuit in FIG. 7, and is a diagram showing transitions of the source voltage of the driving transistor according to high mobility and low mobility.
Figure 23:
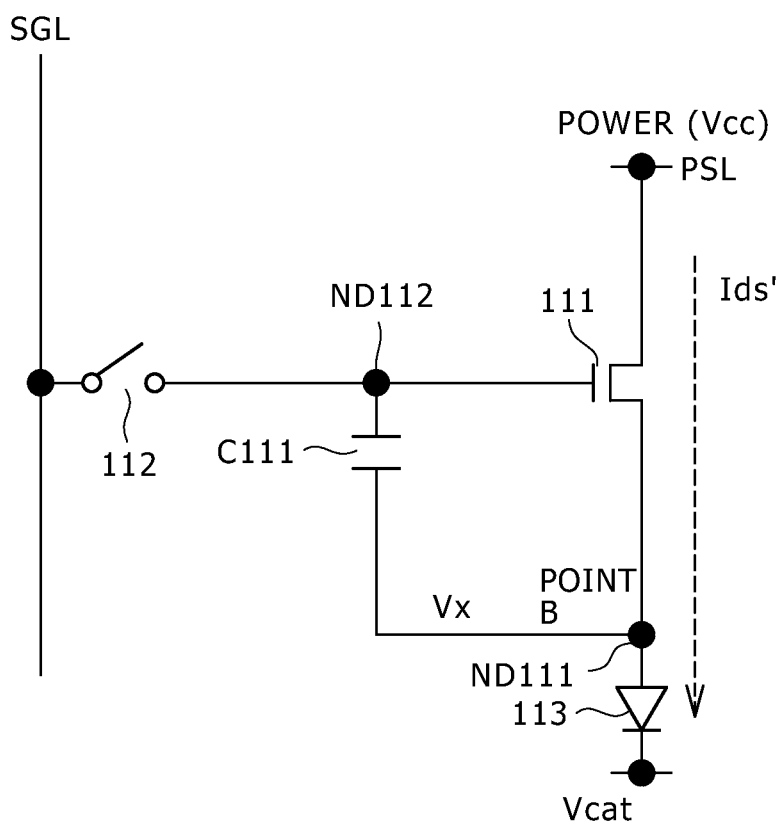
FIG. 23 is a diagram of assistance in explaining the operation of the pixel circuit in FIG. 7, and is a diagram showing an emission state.

Specifically, as shown in FIG. 22, when the mobility μ is high, an amount of current at this time is large, and the source voltage rises quickly. Conversely, when the mobility μ is low, the amount of current is small, and the source voltage rises slowly. Thus, the gate-to-source voltage of the TFT 111 is decreased, reflecting the mobility μ, and becomes the gate-to-source voltage Vgs that completely corrects the mobility after the passage of a certain time.

Finally, as shown in FIGS. 15A to 15C and FIG. 23, the gate pulse GP is changed to a low level to turn off the TFT 112 and thereby end writing, and the EL light emitting element 113 is made to emit light.

Because the gate-to-source voltage of the TFT 111 is constant, the TFT 111 sends a constant current Ids' to the EL light emitting element 113, the voltage Vel rises to a voltage Vx at which the current Ids' flows through the EL light emitting element 113, and the EL light emitting element 113 emits light.

Also, in the pixel circuit 101, the I-V characteristic of the light emitting element 113 is changed as a light emission time is lengthened. Therefore, the potential of a point B (node ND111) in FIG. 23 also is changed. However, the gate-to-source voltage of the TFT 111 is maintained at a constant value, and thus the current flowing through the EL light emitting element 113 does not change. Thus, even when the I-V characteristic of the light emitting element 113 is degraded, the constant current Ids continues flowing at all times, and therefore the luminance of the light emitting element 113 does not change.

In the thus driven pixel circuit, the resistance of the cathode electrode layer or the anode electrode layer is lowered. It is therefore possible to suppress a voltage drop in the electrode part of the light emitting element, prevent the occurrence of a difference in in-plane luminance of the panel, and thus obtain a picture of high picture quality.

In the present first embodiment, a description has been made above of the examples of the first to fourth measures as effective measures to improve picture quality for the display device 100 having the circuit in FIG. 7, that is, a 2Tr+1C pixel circuit including two transistors and one capacitor.

However, while the examples of the first to fourth measures are effective for the display device 100 having the 2Tr+1C pixel circuit, the measures also can be applied to display devices having a pixel circuit of a configuration provided with a TFT or the like for mobility and threshold value cancellation separately in addition to a drive (driving) transistor connected in series with an OLED and a switching transistor.

An example of a constitution of a display device having a 5Tr+1C pixel circuit including five transistors and one capacitor among these display devices will be described below as a second embodiment.

Figure 24:
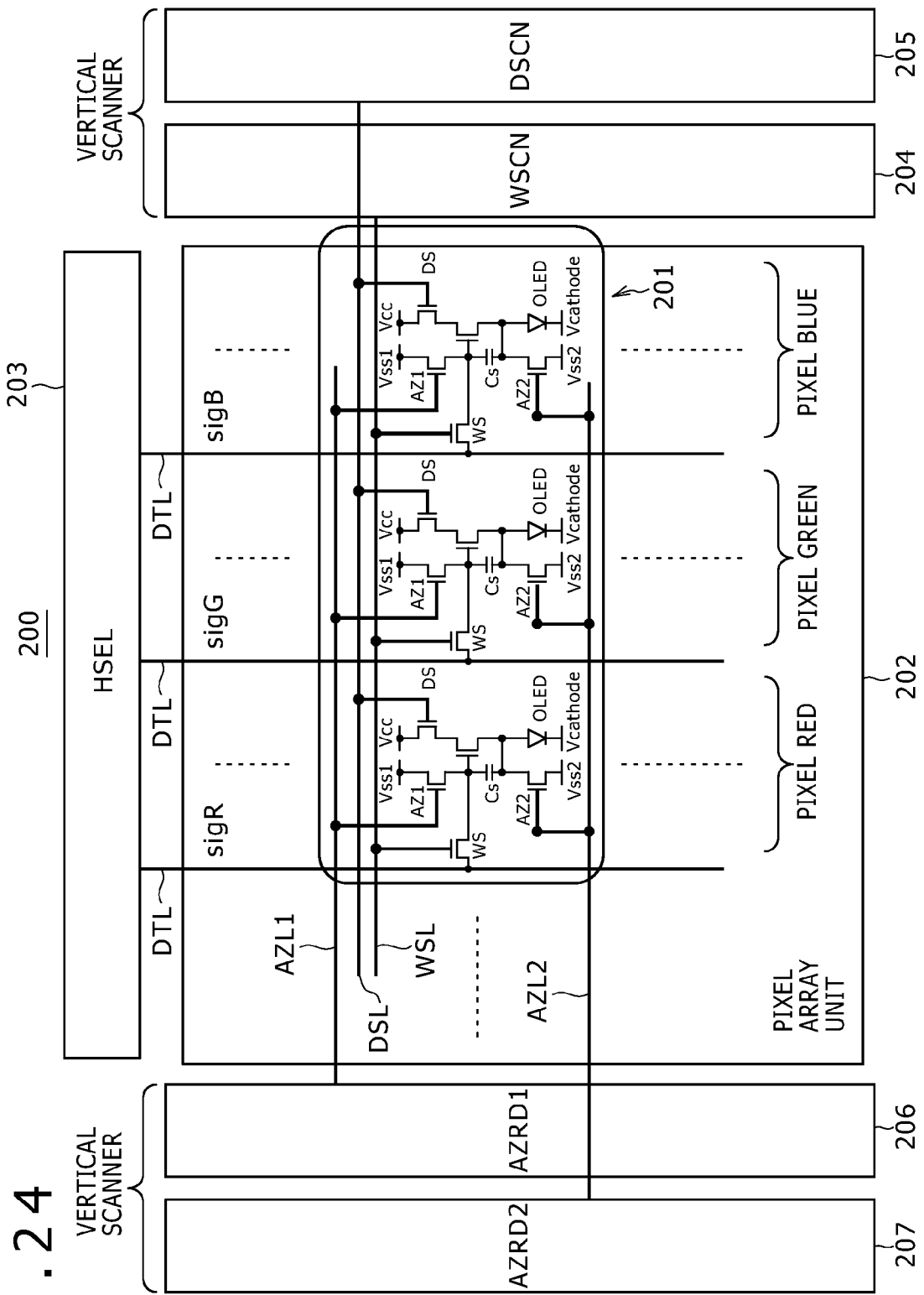
FIG. 24 is a block diagram showing a configuration of an organic EL display device using pixel circuits according to a second embodiment of the present invention.

FIG. 24 is a block diagram showing a configuration of an organic EL display device using a pixel circuit according to the second embodiment of the present invention.

Figure 25:
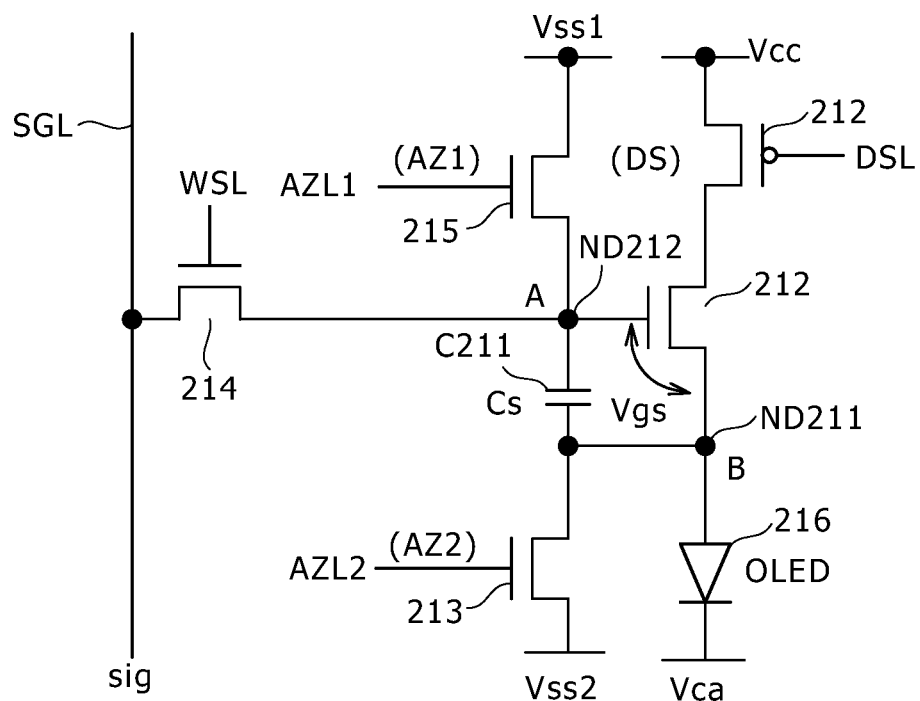
FIG. 25 is a circuit diagram showing a concrete configuration of a pixel circuit according to the second embodiment.

FIG. 25 is a circuit diagram showing a concrete configuration of the pixel circuit according to the present embodiment.

As shown in FIG. 24 and FIG. 25, this display device 200 includes: a pixel array unit 202 having pixel circuits 201 arranged in the form of an m×n matrix; a horizontal selector (HSEL) 203; a write scanner (WSCN) 204; a drive scanner (DSCN) 205; a first auto-zero circuit (AZRD1) 206; a second auto-zero circuit (AZRD2) 207; a signal line SGL selected by the horizontal selector 203 and supplied with a data signal corresponding to luminance information; a scanning line WSL as second driving wiring selected and driven by the write scanner 204; a driving line DSL as first driving wiring selected and driven by the drive scanner 205; a first auto-zero line AZL1 as fourth driving wiring selected and driven by the first auto-zero circuit 206; and a second auto-zero line AZL2 as third driving wiring selected and driven by the second auto-zero circuit 207.

As shown in FIG. 24 and FIG. 25, a pixel circuit 201 according to the present embodiment includes: a p-channel TFT 211; n-channel TFTs 212 to 215; a capacitor C211; a light emitting element 216 formed by an organic EL light emitting element (OLED: an electrooptic element); a first node ND211; and a second node ND212.

The TFT 211 forms a first switch transistor. The TFT 213 forms a second switch transistor. The TFT 215 forms a third switch transistor. The TFT 214 forms a fourth switch transistor.

Incidentally, a line for supplying a power supply voltage Vcc (power supply potential) corresponds to a first reference potential. A ground potential GND corresponds to a second reference potential. VSS1 corresponds to a fourth reference potential. VSS2 corresponds to a third reference potential.

In the pixel circuit 201, the TFT 211, the TFT 212 as drive transistor, the first node ND211, and the light emitting element (OLED) 216 are connected in series with each other between the first reference potential (the power supply potential Vcc in the present embodiment) and the second reference potential (the ground potential GND in the present embodiment). Specifically, the cathode of the light emitting element 216 is connected to the ground potential GND. The anode of the light emitting element 216 is connected to the first node ND211. The source of the TFT 212 is connected to the first node ND211. The drain of the TFT 212 is connected to the drain of the TFT 211. The source of the TFT 211 is connected to the power supply potential Vcc.

The gate of the TFT 212 is connected to the second node ND212. The gate of the TFT 211 is connected to the driving line DSL.

The drain of the TFT 213 is connected to the first node ND211 and the first electrode of the capacitor C211. The source of the TFT 213 is connected to the fixed potential VSS2. The gate of the TFT 213 is connected to the second auto-zero line AZL2. The second electrode of the capacitor C211 is connected to the second node ND212.

The source and the drain of the TFT 214 are connected between the signal line SGL and the second node ND212, respectively. The gate of the TFT 214 is connected to the scanning line WSL.

The source and the drain of the TFT 215 are connected between the second node ND212 and the predetermined potential Vss1, respectively. The gate of the TFT 215 is connected to the first auto-zero line AZL1.

Thus, the pixel circuit 201 according to the present embodiment is configured such that the capacitor C211 as pixel capacitance is connected between the gate and the source of the TFT 212 as a drive transistor, the source potential of the TFT 212 is connected to the fixed potential via the TFT 213 as a switch transistor during a non-emission period, and a connection is established between the gate and the drain of the TFT 212 to correct a threshold value Vth.

The first to fourth measures to improve picture quality, which measures have been described as the first embodiment, are taken in the present second embodiment.

By taking a desired measure, it is possible to suppress a voltage drop in the electrode part of the light emitting element, prevent the occurrence of a difference in in-plane luminance of a panel, and thus obtain a picture of high picture quality.

The operation of the above-described constitution will be described next by centering on the operation of the pixel circuit with reference to FIGS. 26A to 26F.

Incidentally, FIG. 26A shows a driving signal DS applied to the driving line DSL. FIG. 26B shows a driving signal WS (corresponding to the gate pulse GP in the first embodiment) applied to the scanning line WSL. FIG. 26C shows a driving signal AZ1 applied to the first auto-zero line AZL1. FIG. 26D shows an auto-zero signal AZ2 as a driving signal applied to the second auto-zero line AZL2. FIG. 26E shows the potential of the second node ND212. FIG. 26F shows the potential of the first node ND211.

The driving signal DS supplied to the driving line DSL by the drive scanner 205 is maintained at a high level. The driving signal WS supplied to the scanning line WSL by the write scanner 204 is maintained at a low level. The driving signal AZ1 supplied to the auto-zero line AZL1 by the auto-zero circuit 206 is maintained at a low level. The driving signal AZ2 supplied to the auto-zero line AZL2 by the auto-zero circuit 207 is maintained at a high level.

As a result, the TFT 213 is on. At this time, a current flows through the TFT 213, and the source potential Vs of the TFT 212 (the potential of the first node ND211) drops to the potential VSS2. Therefore, the voltage applied to the light emitting element 216 is 0 V, and thus the light emitting element 216 does not emit light.

In this case, even when the TFT 214 is turned on, the voltage retained by the capacitor C211, that is, the gate voltage of the TFT 212, is not changed.

Next, during the period of non-emission of the EL light emitting element 216, as shown in FIGS. 26C and 26D, the driving signal AZ1 supplied to the auto-zero line AZL1 is set to a high level in a state of the driving signal AZ2 supplied to the auto-zero line AZL2 being maintained at the high level. Thereby, the potential of the second node ND212 becomes the potential VSS1.

After the driving signal AZ2 supplied to the auto-zero line AZL2 is changed to a low level, the driving signal DS supplied to the driving line DSL by the drive scanner 205 is changed to a low level for only a predetermined period.

Thereby, the TFT 213 is turned off, and the TFT 215 and the TFT 212 are turned on. Thus, a current flows through the path of the TFT 212 and the TFT 211, and the potential of the first node rises.

Then, the driving signal DS supplied to the driving line DSL by the drive scanner 205 is changed to the high level, and the driving signal AZ1 is changed to the low level.

As a result of the above, the threshold value Vth of the drive transistor TFT 212 is corrected, and a potential difference between the second node ND212 and the first node ND211 becomes the threshold value Vth.

After the passage of a predetermined period in that state, the driving signal WS supplied to the scanning line WSL by the write scanner 204 is maintained at a high level for a predetermined period so that data is written from the data line to the node ND212. The driving signal DS supplied to the driving line DSL by the drive scanner 205 is changed to the high level while the driving signal WS is at the high level. The driving signal WS is shortly changed to the low level.

At this time, the TFT 212 is turned on, and the TFT 214 is turned off, so that a mobility correction is performed.

In this case, because the TFT 214 is off and the gate-to-source voltage Vgs of the TFT 212 is constant, the TFT 212 passes a constant current Ids through the EL light emitting element 216. Thereby, the potential of the first node ND211 rises to a voltage Vx at which the current Ids flows through the EL light emitting element 216, and the EL light emitting element 216 emits light.

Also, in the present circuit, the current-voltage (I-V) characteristic of the EL light emitting element is changed as the light emission time of the EL light emitting element is lengthened. Therefore, the potential of the first node ND211 also is changed. However, because the gate-to-source voltage Vgs of the TFT 212 is maintained at a constant value, the current flowing through the EL light emitting element 216 does not change. Thus, even when the I-V characteristic of the EL light emitting element 216 is degraded, the constant current Ids continues flowing at all times, so that the luminance of the EL light emitting element 216 does not change.

In the thus driven pixel circuit, the resistance of the cathode electrode layer or the anode electrode layer is lowered. It is therefore possible to suppress a voltage drop in the electrode part of the light emitting element, prevent the occurrence of a difference in in-plane luminance of a panel, and thus obtain a picture of high picture quality.

It should be understood by those skilled in the art that various modifications, combinations, subcombinations and alterations may occur depending on design requirements and other factors insofar as they are within the scope of the appended claims or the equivalents thereof.

What is claimed is:

1. A light emitting device comprising:
   a substrate layer including a substrate;
   a plurality of self-emission elements arranged on an first region;
   a first layer including a plurality of electrodes respectively corresponding to each of said self-emission elements, each of said electrodes being electrically connectable to a drive circuit so as to receive a drive current from said driving circuit; and
   a second layer including a first film having first conductivity and a second film having second conductivity,
   wherein said first region has a light-emission region and a non-emission region, said non-emission region surrounding said light-emission region,
   an organic layer is disposed in both of said light-emission region and said non-emission region,
   said first film comprises a plurality of patterned films, each of said patterned films being formed in at least a portion of said non-emission region,
   said second film is formed so as to be common to said self-emission elements and disposed on said first film,
   a film thickness of said second layer in said non-emission region is larger than a film thickness of said second layer in said emission area, and
   said first film is thicker than said second film.

2. The light emitting device according to claim 1, further comprising an insulation layer disposed on said substrate,
   wherein said insulation layer includes an insulation film disposed between said substrate layer and said first layer, within at least a part of said non-emission region.

3. The light emitting device according to claim 2, wherein said second layer approaches said substrate in an second region outside of said first region, and
   none of said insulation layer is disposed between said second layer and said substrate layer in said second region.

4. The light emitting device according to claim 3, wherein said second layer is electrically connected to said substrate layer in said second region.

5. The light emitting device according to claim 3, wherein a part of said first layer is disposed between said second layer and said substrate layer in said second region.

6. The light emitting device according to claim 1, wherein said first conductivity is larger than said second conductivity.

7. The light emitting device according to claim 1, wherein said organic layer is a layer for light emission.

8. The light emitting device according to claim 1, wherein said organic layer is formed so as to be common to said self-emission elements.

9. The light emitting device according to claim 1, wherein said second layer consists of said first film and said second film.

10. The light emitting device according to claim 1, wherein a film thickness of said first film is of an order of micrometers, and a film thickness of said second film is of an order of nanometers.

11. The light emitting device according to claim 1, wherein said substrate layer includes said drive circuit formed on said substrate.

12. A light emitting device comprising:
    a substrate layer including a substrate;
    a plurality of self-emission elements arranged on an first region;
    a first layer including a plurality of electrodes respectively corresponding to each of said self-emission elements, each of said electrodes being electrically connectable to a drive circuit so as to receive a drive current from said driving circuit; and
    a second layer including a first film having first conductivity and a second film having second conductivity,
    wherein said first region has a light-emission region and a non-emission region, said non-emission region surrounding said light-emission region,
    an active layer for light emission is disposed in both of said light-emission region and said non-emission region,
    said first film comprises a plurality of patterned films, each of said patterned films being formed in at least a portion of said non-emission region,
    said second film is formed so as to be common to said self-emission elements and disposed on said first film,
    a film thickness of said second layer in said non-emission region is larger than a film thickness of said second layer in said emission area, and
    said first film is thicker than said second film.

13. The light emitting device according to claim 12, further comprising an insulation layer disposed on said substrate,
    wherein said insulation layer includes an insulation film disposed between said substrate layer and said first layer, within at least a part of said non-emission region.

14. The light emitting device according to claim 13, wherein said second layer approaches said substrate in an second region outside of said first region, and
    none of said insulation layer is disposed between said second layer and said substrate layer in said second region.

15. The light emitting device according to claim 14, wherein said second layer is electrically connected to said substrate layer in said second region.

16. The light emitting device according to claim 14, wherein a part of said first layer is disposed between said second layer and said substrate layer in said second region.

17. The light emitting device according to claim 12, wherein said first conductivity is larger than said second conductivity.

18. The light emitting device according to claim 12, wherein said active layer is formed so as to be common to said self-emission elements.

19. The light emitting device according to claim 12, wherein said second layer consists of said first film and said second film.

20. The light emitting device according to claim 12, wherein a film thickness of said first film is of an order of micrometers, and a film thickness of said second film is of an order of nanometers.

21. The light emitting device according to claim 12, wherein said substrate layer includes said drive circuit formed on said substrate.

* * * * *